United States Patent
Rushkin et al.

(10) Patent No.: US 7,129,011 B2
(45) Date of Patent: Oct. 31, 2006

(54) PHOTOSENSITIVE RESIN COMPOSITIONS

(75) Inventors: Ilya Rushkin, Walpole, MA (US); Ahmad A. Naiini, East Greenwich, RI (US); Richard Hopla, Cranston, RI (US); Pamela J. Waterson, Northbridge, MA (US); William D. Weber, Rumford, RI (US); David B. Powell, Minnetonka, MN (US)

(73) Assignee: Arch Specialty Chemicals, Inc., Norwalk, CT (US)

( * ) Notice: Subject to any disclaimer, the term of this patent is extended or adjusted under 35 U.S.C. 154(b) by 111 days.

(21) Appl. No.: 10/860,783

(22) Filed: Jun. 3, 2004

(65) Prior Publication Data

US 2004/0253537 A1    Dec. 16, 2004

Related U.S. Application Data

(60) Provisional application No. 60/476,816, filed on Jun. 6, 2003.

(51) Int. Cl.
  *G03F 7/004*  (2006.01)
  *G03F 7/30*  (2006.01)
(52) U.S. Cl. .............. 430/18; 430/270.1; 430/325; 430/330; 430/905
(58) Field of Classification Search .......... 430/18, 430/270.1, 325, 330, 906
See application file for complete search history.

(56) References Cited

U.S. PATENT DOCUMENTS

| 5,486,447 A * | 1/1996 | Hammerschmidt et al. . 430/197 |
| 5,760,162 A * | 6/1998 | Sezi et al. ................... 528/310 |
| 6,183,934 B1 * | 2/2001 | Kawamonzen ........... 430/270.1 |
| 2004/0023147 A1 * | 2/2004 | Hirano et al. ............... 430/191 |
| 2004/0229166 A1 * | 11/2004 | Rushkin et al. .......... 430/281.1 |

FOREIGN PATENT DOCUMENTS

JP    11-153866    *  6/1999
JP    2001-125267    5/2001

OTHER PUBLICATIONS

U.S. Appl. No. 60/453,869 (U.S. Appl. No. 10/795,577, U.S. Patent Pub 2004/0229166 A1).*

* cited by examiner

*Primary Examiner*—John S. Chu
(74) *Attorney, Agent, or Firm*—Ohlandt, Greeley, Ruggiero & Perle, LLP

(57) ABSTRACT

A heat resistant negative working photosensitive composition that comprises
  (a) one or more polybenzoxazole precursor polymers (I):

$$G-NH-Ar^4-NH + \overset{O}{\underset{}{C}} - Ar^3 - \overset{O}{\underset{}{C}} - NH - Ar^1(OH)_2 - NH\!\!\rightarrow_x \!\!( - Ar^3 - \overset{O}{\underset{}{C}} - NH - Ar^2 - NH\!\!\rightarrow_y G$$

wherein x is an integer from about 10 to about 1000, y is an integer from 0 to about 900 and (x+y) is about less then 1000; $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that may contain silicon; $Ar^3$ is a divalent aromatic group, a divalent aliphatic group, a divalent heterocyclic group, or mixtures thereof; $Ar^4$ is $Ar^1(OH)_2$ or $Ar^2$; G is a monovalent organic group a carbonyl, carbonyloxy or sulfonyl group;
  (b) one or more photo-active compounds which release acid upon irradiation (PAGs);
  (c) one or more latent crosslinkers each of which contains at least two ~N—$(CH_2OR)_n$ units (n=1 or 2, wherein R is a linear or branched $C_1$–$C_8$ alkyl group);
  (d) at least one solvent, and
  (e) at least one dissolution rate modifier,
with the proviso that when the latent crosslinker is highly reactive, the dissolution rate modifier does not contain carboxylic acid groups.

52 Claims, No Drawings

PHOTOSENSITIVE RESIN COMPOSITIONS

Priority of U.S. Provisional Patent Application Ser. No. 60/476,816 both filed on Jun. 6, 2003 are claimed under 35 U.S.C. §119(e).

FIELD OF THE INVENTION

The present invention relates to negative-working photosensitive resin compositions. More specifically, the present invention relates to negative-working, chemically amplified, aqueous base developable photosensitive polybenzoxazole (PBO) precursor compositions that are suitable for applications in the field of microelectronics.

BACKGROUND OF THE INVENTION

In microelectronic applications, polymers that demonstrate high temperature resistance are generally well known. Precursors of such polymers, such as polyimide precursor polymers and polybenzoxazole precursor polymers can be made photoreactive with suitable additives. The precursors are converted to the desired polymer by known techniques such as exposure to high temperatures. The polymer precursors are used to prepare protective layers, insulating layers, and relief structures of highly heat-resistant polymers.

Negative-working photosensitive compositions containing high temperature resistant polymers have been disclosed in, for example, DE-A-2,308,830; DE-A-2,437,348; EP-A-0 119,162, or EP-A-0 624,826, U.S. Pat. No. 5,486,447, U.S. Pat. No. 5,856,065 and U.S. Pat. No. 6,010,825. The polyamide resist resin in these disclosures contained pendant olefinic groups, which can be crosslinked upon action of irradiation of suitable wavelength, thus forming a negative pattern. While these systems had good imaging properties (high sensitivity, high contrast, low unexposed film loss), some of them (DE-A-2,308,830; DE-A-2,437,348; EP-A-0 119,162, or EP-A-0 624,826) employed organic solvents as developers, which creates environmental concerns during device manufacture.

Furthermore, the prior art photosensitive compositions containing high temperature resistant polymers used NMP (N-Methyl-2-pyrrolidone) as a solvent. Since it has been established that NMP has detrimental effects on the performance of chemically amplified 248 and 193 nm photoresists (U.S. Pat. No. 6,277,546 B1; "Influence of Polymer Properties On Airborne Chemical Contamination of Chemically Amplified Resists", W. D, Hinsberg, S. A. MacDonald, N. J. Clecak, C. D. Snyder, and H. Ito, SPIE vol. 1925, pp. 43–52, 1993), use of NMP-containing compositions is prohibited in many semiconductor fabrication facilities where such chemically amplified resists are used.

There are examples in the literature of positive working photosensitive formulations of highly heat-resistant polymer precursors, which contain no NMP and developable in alkaline developer (U.S. Pat. No. 4,339,521, U.S. Pat. No. 5,449,584, U.S. Pat. No. 6,127,086, U.S. Pat. No. 6,177,225 B1, U.S. Pat. No. 6,214,516 B1). While these inventions address the environmental concerns they sometimes exhibit inferior imaging properties such as low contrast and somewhat high dark erosion.

The purpose of this invention is to provide a negative working photosensitive composition suitable for making high temperature resistant patterns, which would have excellent imaging properties, contain no NMP and employ environmentally acceptable aqueous base solutions as developer.

BRIEF SUMMARY OF THE INVENTION

The present invention relates to a heat resistant negative working photosensitive composition that comprises (a) one or more polybenzoxazole precursor polymers (I):

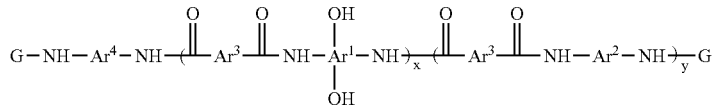

wherein x is an integer from about 10 to about 1000, y is an integer from 0 to about 900 and (x+y) is about less then 1000; $Ar^1$ is a tetravalent aromatic group, a tetravalent heterocyclic group, or mixtures thereof; $Ar^2$ is a divalent aromatic, a divalent heterocyclic, a divalent alicyclic, a divalent aliphatic group that may contain silicon or mixtures thereof; $Ar^3$ is a divalent aromatic group, a divalent aliphatic group, a divalent heterocyclic group, or mixtures thereof; $Ar^4$ can be $Ar^1$ $(OH)_2$ or $Ar^2$; G is H or an organic group J having a carbonyl, carbonyloxy or sulfonyl group attached directly to the terminal NH of the polymer;

(b) one or more photo-active compounds which release acid upon irradiation (PAGs);

(c) one or more latent crosslinkers each of which contains at least two $\sim$N—$(CH_2OR)_n$ units where n=1 or 2, and R is a linear or branched $C_1$–$C_8$ alkyl group);

(d) at least one solvent; and (e) at least one dissolution rate modifier with the proviso that when the latent crosslinker is highly reactive, the dissolution rate modifier does not contain carboxylic acid groups.

Furthermore, the invention comprises a method of use for such compositions and the articles of manufacture, particularly electronic parts, obtained by the combination of the composition and the method of use according to the invention. The invention comprises a process for forming a patterned image on a substrate wherein a process for forming a negative tone relief image. The process comprises the steps of:

(a) providing a substrate, (b) coating on said substrate a negative-working photosensitive composition comprising one or more polybenzoxazole precursors having the structure (I),

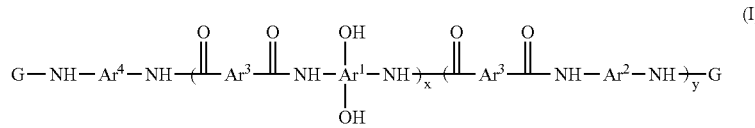
(I)

wherein Ar¹, Ar², Ar³, and G are as defined above; one or more photo-active compounds which release acid upon irradiation, one ore more latent crosslinkers each of which contains at least two ~N—(CH$_2$OR)$_n$ units where n=1 or 2, and R is a linear or branched C$_1$–C$_8$ alkyl group) at least one solvent and at least one dissolution rate modifier (all as described above) with the proviso that when the latent crosslinker is highly reactive, the dissolution rate modifier does not contain carboxylic acid groups, thereby forming a coated substrate;

(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

DETAILED DESCRIPTION OF THE INVENTION

The present invention relates to a heat resistant negative working photosensitive composition that comprises
(a) one or more polybenzoxazole precursor polymers (I):

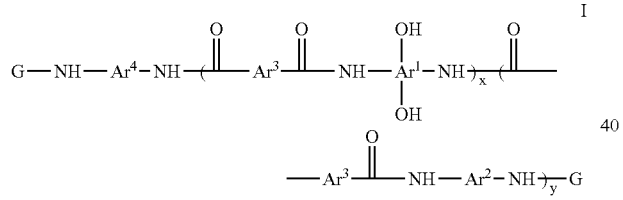

wherein x is an integer from about 10 to about 1000, y is an integer from 0 to about 900 and (x+y) is less than about 1000; Ar¹ is a tetravalent aromatic group, a tetravalent heterocyclic group, or mixtures thereof; Ar² is a divalent aromatic, a divalent heterocyclic, a divalent alicyclic, a divalent aliphatic group that may contain silicon or mixtures thereof; Ar³ is a divalent aromatic group, a divalent aliphatic group, a divalent heterocyclic group, or mixtures thereof; Ar⁴ can be Ar¹(OH)$_2$ or Ar²; G is H or an organic group J having a carbonyl, carbonyloxy or sulfonyl group attached directly to the terminal NH of the polymer;
(b) one or more photo-active compounds which release acid upon irradiation (PAGs);
(c) one or more latent crosslinkers each of which contains at least two —N—(CH$_2$OR)$_n$ units where n=1 or 2, and R is a linear or branched C$_1$–C$_8$ alkyl group);
(d) at least one solvent, and
(e) at least one dissolution rate modifier
with the proviso that when the latent crosslinker is highly reactive, the dissolution rate modifier does not contain carboxylic acid groups.

The negative-working photosensitive composition has one or more polybenzoxazole precursors comprising the structure shown in (I) wherein x an integer from about 10 to about 1000, y is an integer from about 0 to about 900 and (x+y) is about less then 1000. The preferred range for x is from about 10 to about 100 and for y is from about 0 to about 100. The most preferred range for x is from about 10 to about 50 and for y is from about 0 to about 5.

In Structure I, Ar¹ is a tetravalent aromatic group or a tetravalent heterocyclic group, or mixtures thereof. Examples of Ar¹ include, but are not limited to, the following structures:

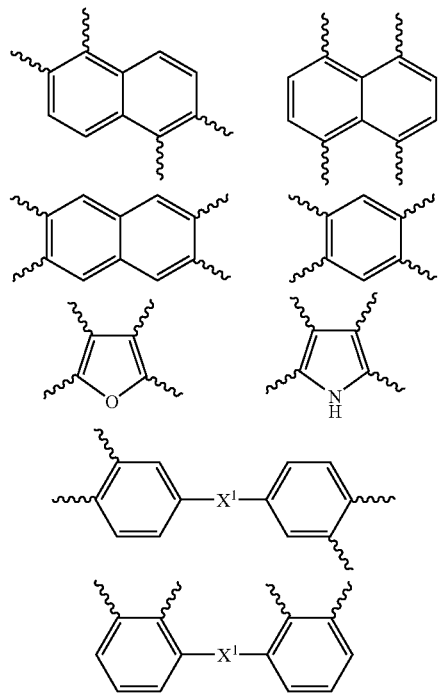

wherein X¹ is —O—, —S—, —C(CF$_3$)$_2$—, —CH$_2$—, —SO$_2$—, —NHCO— or —SiR¹$_2$— and each R¹ is independently a C$_1$–C$_7$ linear or branched alkyl or C$_5$–C$_8$ cycloalkyl group. Examples of R¹ include, but are not limited to, —CH$_3$, —C$_2$H$_5$, n-C$_3$H$_7$, i-C$_3$H$_7$, n-C$_4$H$_9$, t-C$_4$H$_9$, and cyclohexyl. A mixture of two or more Ar¹ groups may be employed.

In Structure I, Ar² is a divalent aromatic, a divalent heterocyclic, a divalent alicyclic, or a divalent aliphatic group that may contain silicon. Examples of Ar² include but are not limited to

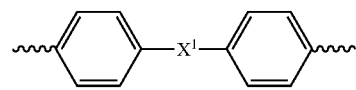

-continued

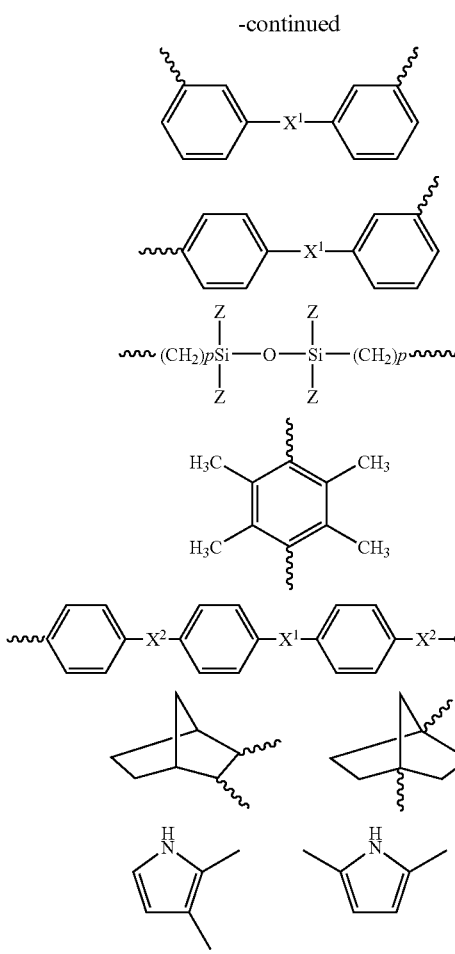

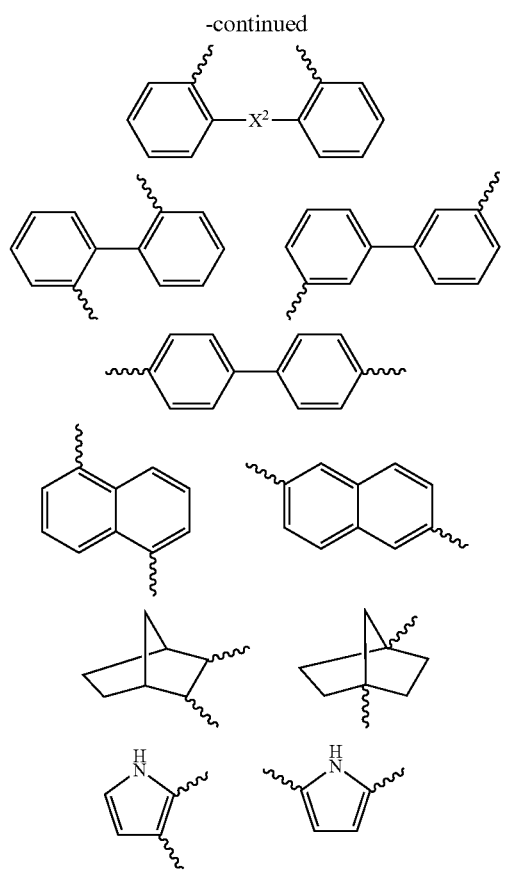

wherein $X^2$ is as defined previously.

In Structure I, $Ar^4$ is $Ar^1$ $(OH)_2$ or $Ar^2$.

G is H or an organic group J having a carbonyl, carbonyloxy or sulfonyl group attached directly to the terminal NH of the polymer, which may be further substituted by other functional groups such as vinyl, carbonyl, ether, ester, or carboxylic acid. Examples of J groups include, but are not limited to, the following structures:

wherein $X^1$ is as defined before, $X^2$ is —O—, —S—, —C(CF$_3$)$_2$—, —CH$_2$—, —SO$_2$—, or —NHCO—, Z=H or $C_1$–$C_8$ linear, branched or cyclic alkyl and p is an integer from 1 to 6. Examples of suitable Z groups include, but are not limited to, methyl, ethyl, propyl, isopropyl, n-butyl, sec-butyl, t-butyl, n-octyl, cyclopentyl, cyclohexyl or cyclooctyl. A mixture of two or more $Ar^2$ groups may be employed.

$Ar^3$ is a divalent aromatic, a divalent alicyclic, or a divalent heterocyclic group. Examples of $Ar^3$ include but are not limited to:

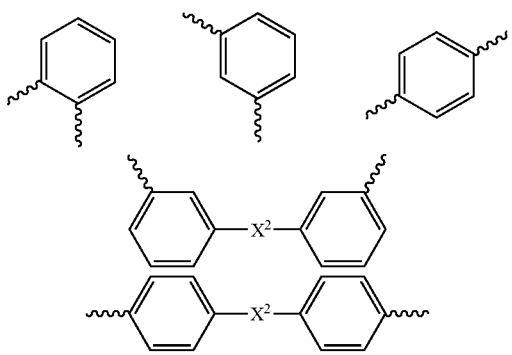

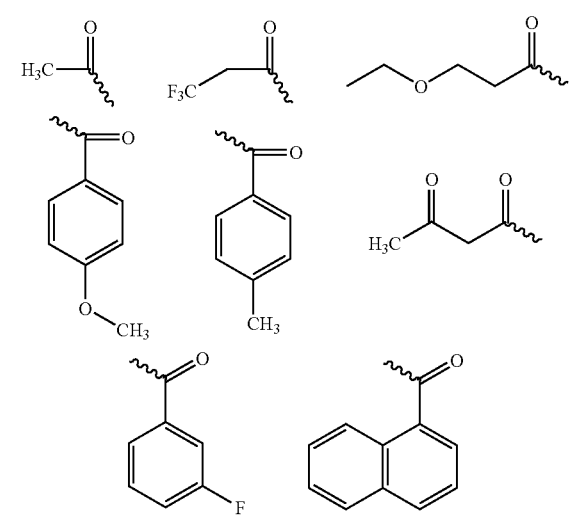

-continued

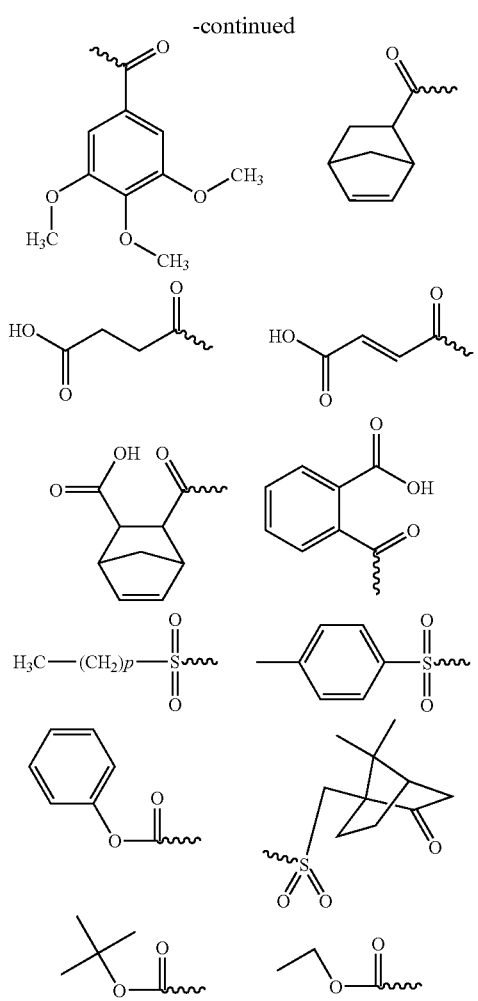

a one or two-step synthesis. In the first step, monomers having structures (II), (III), and (IV) are reacted in the presence of a base to synthesize a polybenzoxazole precursor base polymer having Structure V (Structure I, G=H).

In the second synthesis step, the terminal amino groups of the polybenzoxazole precursor base polymer are reacted with a compound J-M, where J is as described before and M is a reactive group, to produce a polymer having Structure I where G=J.

Examples of monomers having the Structure (II) containing $Ar^1$ include but are not limited to 2,2-bis(3-amino-4-hydroxyphenyl)hexafluoropropane, 3,3'-dihydroxy-4,4'-diaminodiphenylether, 3,3'-dihydroxybenzidine, 4,6-diaminoresorcinol, and 2,2-bis(3-amino-4-hydroxyphenyl)propane. The substitution pattern of the two hydroxy and two amino groups in the monomer of Structure II may be any of the possible substitution patterns with the proviso that the each amino group has an ortho relationship with a hydroxyl group in order to be able to form the benzoxaxole ring. Furthermore, the polybenzoxazole precursor base polymer may be synthesized using a mixture of two or more monomers described by Structure II.

Examples of monomers having the Structure (III) containing $Ar^2$ include, but are not limited to, 5(6)-diamino-1-(4-aminophenyl)-1,3,3-trimethylindane (DAPI), m-phenylenediamine, p-phenylenediamine, 2,2'-bis(trifluoromethyl)-4,4'-diamino-1,1'-biphenyl, 3,4'-diaminodiphenyl ether, 3,3'-diaminodiphenyl ether, 2,4-tolylenediamine, 3,3'-diaminodiphenyl sulfone, 3,4'-diaminodiphenyl sulfone, 4,4'-diaminodiphenyl sulfone, 4,4'-diaminodiphenylmethane, 3,4'-diaminodiphenylmethane, 4,4'-diaminodiphenyl ketone, 3,3'-diaminodiphenyl ketone, 3,4'-diaminodiphenyl ketone, 1,3-bis(4-aminophenoxy)benzene, 1,3-bis(3-aminophenoxy)benzene, 1,4-bis(γ-aminopropyl)tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 2,5-dimethylnonamethylenediamine, decamethylenediamine, ethylenediamine, propylenediamine, 2,2-dimethylpropylenediamine, 1,10-diamino-1,10-dimethyldecane, 2,11-diaminododecane, 1,12-diaminooctadecane, 2,17-diaminoeicosane, 3,3'-dimethyl-4,4'-diaminodiphenylmethane, bis(4-aminocyclohexyl)

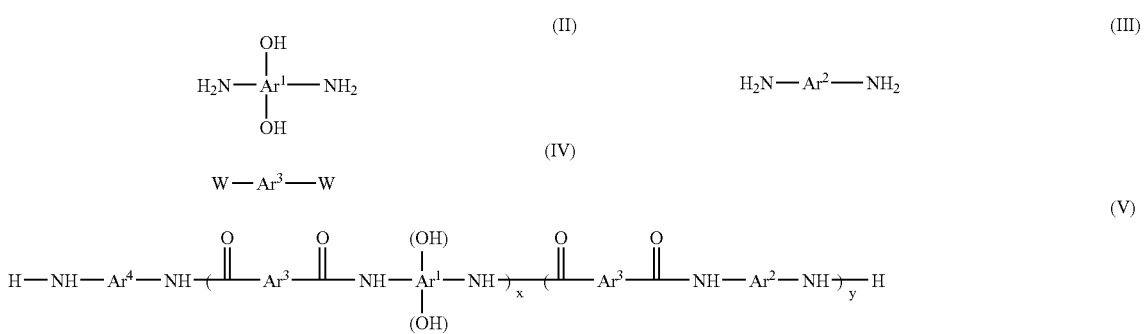

wherein $Ar^1$, $Ar^2$, $Ar^3$, x, and y are as previously defined, and W is C(O)Cl, COOH or $COOR^2$ and wherein $R^2$ is a $C_1$—$C_7$ linear or branched alkyl group or a $C_5$–$C_8$ cycloalkyl group. Examples of $R^2$ include, but are not limited to, —$CH_3$, —$C_2H_5$, n-$C_3H_7$, i-$C_3H_7$, n-$C_4H_9$, t-$C_4H_9$, and cyclohexyl.

methane, 3,3'-diaminodiphenylethane, 4,4'-diaminodiphenylethane, 4,4'-diaminodiphenyl sulfide, 2,6-diaminopyridine, 2,5-diaminopyridine, 2,6-diamino-4-trifluoromethylpyridine, 2,5-diamino-1,3,4,-oxadiazole, 1,4-diaminocyclohexane, 4,4'-methylenedianiline, 4,4'- methylene-bis(o-choloroaniline), 4,4'-methylene-bis(3-methylaniline), 4,4'-methylene-bis(2-ethylaniline), 4,4'-methylene-bis(2-methoxyaniline), 4,4'-oxy-dianiline, 4,4'-oxy-bis-(2-methoxyaniline), 4,4'-oxy-bis-(2-chloroaniline), 4,4'-thio-dianiline, 4,4'-thio-bis-(2-methylaniline), 4,4'-thio-bis-(2-methyoxyaniline), 4,4'-thio-bis-(2-chloroaniline). Furthermore, the polybenzoxazole precursor base polymer may be synthesized using a mixture of two or more monomers described by Structure III.

Monomers having the Structure IV are diacids, diacid dichlorides and diesters. Examples of suitable dicarboxylic acids (W=COOH) include, but are not limited to, 4,4'-diphenyletherdicarboxylic acid, terephthalic acid, isophthalic acid and mixtures thereof. Examples of suitable diacid chlorides (W=COCl) include, but are not limited to, isophthaloyl dichloride, phthaloyl dichloride, terphthaloyl dichloride, 4,4'-diphenyletherdicarboxylic acid dichloride, and mixtures thereof. Examples of suitable dicarboxylic esters (W=CO$_2$R$^2$) include but are not limited to: dimethylisophthalate, dimethylphthalate, dimethylterphthalate, diethylisophthalate, diethylphthalate, diethylterphthalate and mixtures thereof.

In the first synthetic step, monomers having Structures (II) and (III) and (IV) can react to produce polybenzoxazole precursor base polymer (V). Any conventional method for reacting a dicarboxylic acid or its dichloride or diester with at least one aromatic and/or heterocyclic dihydroxydiamine, and optionally, with at least one diamine, may be used. Generally, the reaction for diacids (W=C(O)Cl) is carried out at about −10° C. to about 30° C. for about 6 to about 48 hours in the presence of an approximately stoichiometric amount of amine base. Examples of suitable amine bases include, but are not limited to pyridine, triethyl amine, 1,8-diazabicyclo[5.4.0]undec-7-ene (DBU), 1,5-diazabicyclo[4.3.0]non-5-ene (DBN), dimethylpyridine, and dimethylaniline. The polybenzoxazole precursor base polymer V may be isolated by precipitation into water, recovered by filtration and dried. Descriptions of suitable syntheses employing diesters or diacids may be found in U.S. Pat. No. 4,395,482, U.S. Pat. No. 4,622,285, and U.S. Pat. No. 5,096,999, herein incorporated by reference.

The preferred reaction solvents are N-methyl-2-pyrrolidone (NMP), gamma-butyrolactone (GBL), N,N-dimethylformamide (DMF), N,N-dimethylacetamide (DMAc), dimethyl-2-piperidone, dimethylsulfoxide (DMSO), sulfolane, and diglyme. The most preferred solvents are N-methyl-2-pyrrolidone (NMP) and gamma-butyrolactone (GBL).

Monomers having structure II, III, and IV are employed such that the ratio of [(II)+(III)]/(IV) is generally from about 1 to about 1.2. Preferably, the ratio of [(II)+(III)]/(IV) is generally from about 1 to about 1.1. The monomer having the Structure (II) is employed from about 10 to about 100 mole % of [(II)+(III)] and the monomer having Structure (III) is employed from about 0 to about 90 mole % of [(II)+(III)]. Distribution of the polymeric units resulting from monomers having the Structures II and III in the polybenzoxazole precursor base polymer (enclosed in brackets in Structures I and V), may be random or in blocks within it.

In Structure I and V, x is an integer from about 10 to about 1000, y is an integer from about 0 to about 900 and (x+y) is about less then 1000. A preferred range for x is from about 10 to about 300 and a preferred range for y is from about 0 to about 250. A more preferred range for x is from about 10 to about 100 and a more preferred range for y is from about 0 to about 100. The most preferred range for x is from about 10 to about 50 and a most preferred range for y is from about 0 to about 5.

The amount of (x+y) can be calculated by dividing the numeric average molecular weight (Mn) of a polymer of Structure I by the average molecular weight of the repeat unit. The value of Mn can be determined by such standard methods as membrane osmometry or gel permeation chromatography as described, for example, in Jan Rabek, Experimental Methods in Polymer Chemistry, John Wiley Sons, New York, 1983.

It should be noted that molecular weight and inherent viscosity of the polymers and therefore, x and y at a constant stoichiometry, can have a wide range depending on the reaction conditions such as the purity of the solvent, the humidity, presence or absence of a blanket of nitrogen or argon gas, reaction temperature, reaction time, and other variables.

In the second synthesis step, polybenzoxazole base polymer (V) is reacted with J-M to produce the polybenzoxazole precursor polymer (I) where J is as described before and M is a reactive leaving group. Examples of M groups include, but are not limited to, Cl, Br, mesylate, triflate, substituted carbonyloxy groups, and substituted carbonate groups. Examples of suitable classes of J-M compounds includes but are not limited to carbon and sulfonic acid chlorides, carbon and sulfonic acid bromides, linear and cyclic carbon and sulfonic acid anhydrides, and alkoxy or aryloxy substituted acid chlorides. Examples of suitable J-M compounds include maleic anhydride, succinic anhydride, acetic anhydride, propionic anhydride, norbornene anhydride, phthalic anhydride, camphor sulfonic acid anhydride, trifluoromethane sulfonic acid anhydride, methanesulfonic acid anhydride, p-toluenesulfonic acid anhydride, ethanesulfonic acid anhydride, butanesulfonic acid anhydride, perfluorobutanesulfonic acid anhydride, acetyl chloride, methanesulfonyl chloride, trifluoromethanesulfonyl chloride, benzoyl chloride, norbornene carboxylic acid chloride, di-t-butyl dicarbonate, dimethyl dicarbonate, diethyldicarbonate, dibutyldicarbonate, t-butyl chloroformate, ethyl chloroformate, n-butyl chloroformate, and methyl chloroformate. Further examples include compounds having the structures shown below.

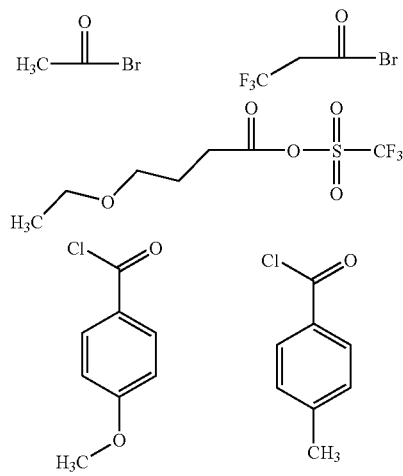

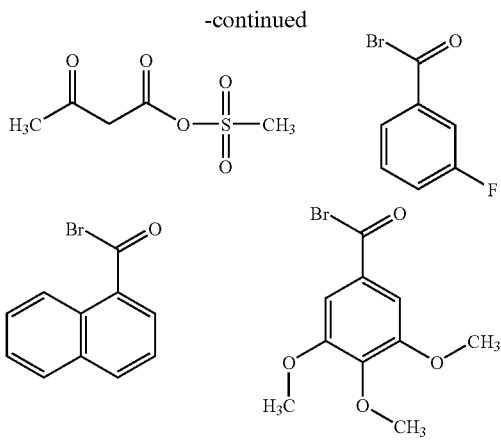

The reaction can be carried out in a suitable solvent by addition of J-M to a dry solution of the polybenzoxazole precursor base polymer at a temperature from about −25° C. to about 40° C. The more preferred temperature is from about 0° C. to about 25° C. The most preferred temperature is from about 5° C. to about 10° C. The reaction time is from about 1 hour to about 24 hours. The molar amount of J-M employed is a slightly excess (3–6%) of the sum of the molar amounts of monomer of structures II and III less the molar amount of monomer of structure IV. Addition of organic or inorganic base may also be employed. Examples of suitable organic amine bases include, but are not limited, to pyridine, triethyl amine, 1,8-diazabicyclo[5.4.0]undec-7-ene (DBU), 1,5-diazabicyclo[4.3.0]non-5-ene (DBN), dimethylpyridine, and dimethylaniline. Examples of other suitable bases include sodium hydroxide, sodium carbonate, and sodium silicate.

The preferred reaction solvents are propylene glycol methyl ether acetate (PGMEA), N-methyl-2-pyrrolidone (NMP), gamma-butyrolactone (GBL), N,N-dimethylformamide (DMF), N,N-dimethylacetamide (DMAc), dimethyl-2-piperidone, dimethylsulfoxide (DMSO), tetrahydrofuran (THF), acetone, sulfolane, and diglyme. The most preferred solvents are diglyme and PGMEA.

The negative-working photosensitive composition of the present invention uses photoactive compounds that release acid upon irradiation. Such materials are commonly called Photo-Acid Generators (PAGs). PAGs of the present invention are preferably active to the radiation between about 300 nm to about 460 nm. They should form a homogeneous solution in the photosensitive composition % and produce strong acid upon irradiation. Examples of such acids include hydrogen halides or a sulfonic acid. The classes of such PAGs include, but are not limited to, oxime sulfonates, triazides, diazoquinone sulfonates, or sulfonium or iodonium salts of sulfonic acids. Examples of suitable PAGs include but are not limited to:

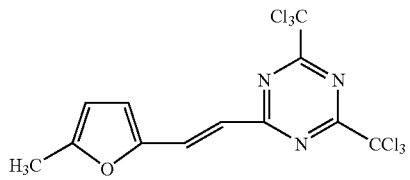

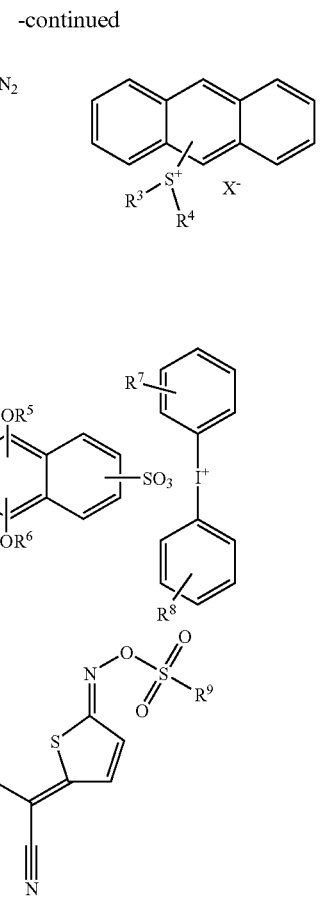

where $R^3$ and $R^4$ are each independently linear, branched or cyclic alkyl or aryl group containing 1 to 20 carbon atoms and $X^-$ is $R^{10}SO_3^-$ ($R^{10}$ is a substituted or unsubstituted, linear, branched or cyclic $C_1$–$C_{25}$ alkyl or a single or multinuclear aryl group having a total of from 6 to 25 carbons; $R^5$, $R^6$, $R^7$ and $R^8$ are independently linear, branched or cyclic alkyl groups and $R^9$ is a linear or branched $C_1$–$C_8$ alkyl, $C_5$–$C_8$ cycloalkyl, camphoroyl or toluyl.

Alternatively, acid could be generated by a combination of a PAG and a sensitizer. In such systems energy of radiation is absorbed by the sensitizer and transmitted in some manner to the PAG. The transmitted energy causes PAG decomposition and generation of photoacid. Any suitable photoacid generator compound may be used. Suitable classes of photoacid generators generating sulfonic acids include, but are not limited to, sulfonium or iodonium salts, oximidosulfonates, bissulfonyldiazomethane compounds, and nitrobenzylsulfonate esters. Suitable photoacid generator compounds are disclosed, for example, in U.S. Pat. Nos. 5,558,978 and 5,468,589, which are incorporated herein by reference. Other suitable photoacid generators are perfluoroalkyl sulfonyl methides and perfluoroalkyl sulfonyl imides as disclosed in U.S. Pat. No. 5,554,664.

Still other suitable examples of photoacid generators are triphenylsulfonium bromide, triphenylsulfonium chloride, triphenylsulfonium iodide, triphenylsulfonium hexafluorophosphate, triphenylsulfonium hexafluoroarsenate, triphenylsulfonium hexafluoroarsenate, triphenylsulfonium trifluoromethanesulfonate, diphenylethylsulfonium chloride, phenacyidimethylsulfonium chloride, phenacyltetrahydrothiophenium chloride, 4-nitrophenacyltetrahydrothiopheniumn chloride, and 4-hydroxy-2-methylphenylhexahydrothiopyrylium chloride.

Additional examples of suitable photoacid generators for use in this invention include triphenylsulfonium perfluorooctanesulfonate, triphenylsulfonium perfluorobutanesulfonate, methylphenyldiphenylsulfonium perfluorooctanesulfonate, methylphenyldiphenysulfonium perfluorooctanesulfonate, 4-n-butoxyphenyldiphenylsulfonium perfluorobutanesulfonate, 2,4,6-trimethylphenyldiphenylsulfonium perfluorobutanesulfonate, 2,4,6-trimethylphenyldiphenylsulfonium benzenesulfonate, 2,4,6-trimethylphenyldiphenylsulfonium 2,4,6-triisopropylbenzenesulfonate, phenylthiophenyldiphenylsulfonium 4-dodecylbenzensulfonic acid, tris(-t-butylphenyl)sulfonium perfluorooctanesulfonate, tris(-t-butylphenyl)sulfonium perfluorobutanesulfonate, tris(-t-butylphenyl)sulfonium 2,4,6-triisopropylbenzenesulfonate, tris(-t-butylphenyl)sulfonium benzenesulfonate, and phenylthiophenyldiphenylsulfonium perfluorooctanesulfonate.

Examples of suitable iodonium salts for use in this invention include, but are not limited to, diphenyl iodonium perfluorobutanesulfonate, bis-(t-butylphenyl)iodonium perfluorobutanesulfonate, bis-(t-butylphenyl)iodonium perfluorooctanesulfonate, diphenyl iodonium perfluorooctanesulfonate, bis-(t-butylphenyl)iodonium benzenesulfonate, bis-(t-butylphenyl)iodonium 2,4,6-triisopropylbenzenesulfonate, and diphenyliodonium 4-methoxybenzensulfonate.

Further examples of suitable photoacid generators for use in this invention are bis(p-toluenesulfonyl)diazomethane, methylsulfonyl p-toluenesulfonyldiazomethane, 1-cyclohexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl)diazomethane, 1-p-toluenesulfonyl-1-cyclohexylcarbonyldiazomethane, 2-methyl-2-(p-toluenesulfonyl)propiophenone, 2-methanesulfonyl-2-methyl-(4-methylthiopropiophenone, 2,4-methyl-2-(p-toluenesulfonyl)pent-3-one, 1-diazo-1-methylsulfonyl-4-phenyl-2-butanone, 2-(cyclohexylcarbonyl-2-(p-toluenesulfonyl)propane, 1-cyclohexylsulfonyl-1 cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2 diazo-2-(p-toluenesulfonyl)acetate, 2-nitrobenzyl p-toluenesulfonate, 2,6-dinitrobenzyl p-toluenesulfonate, and 2,4-dinitrobenzyl p-trifluoromethylbenzenesulfonate.

Examples of sensitizers include but are not limited to: 9-methylanthracene, anthracenemethanol, acenaththalene, thioxanthone, methyl-2-naphthyl ketone, 4-acetylbiphenyl, 1,2-benzofluorene.

The latent crosslinker of this invention should contain at least two —N—$(CH_2$—$OR)_n$ units (n=1 or 2). When such structure interacts with an acid, formed after PAG irradiation, a carbocation is believed to be formed (U.S. Pat. No. 5,512,422):

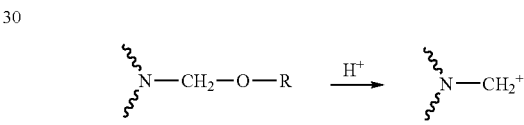

The carbocation formed from the crosslinker can then react with an OH group in a polymer chain or undergo a Friedel Crafts reaction with an aromatic ring. Reaction of two or more such sites of the crosslinker with two or more polymer chains results in crosslinks as shown in the scheme below for R=Me. The crosslinks render the polymer less soluble in developer and creates the solubility differential with the unexposed areas necessary for image formation. Enough crosslinkers render it insoluble.

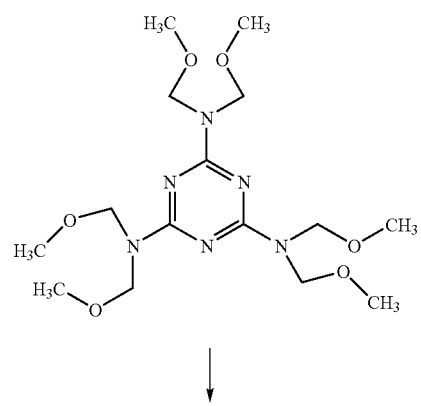

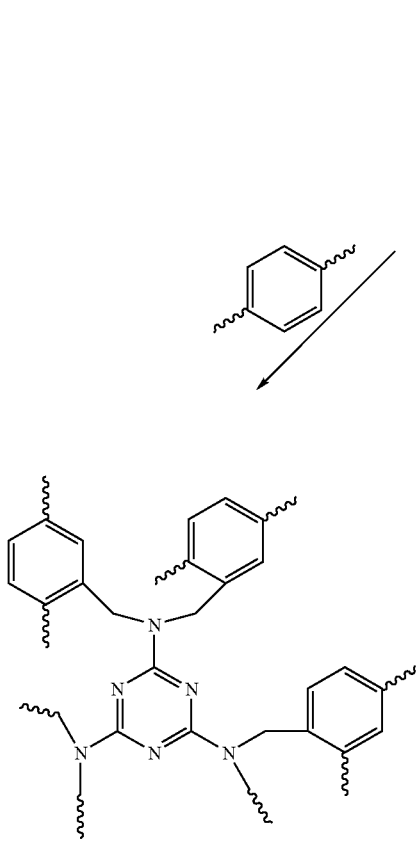
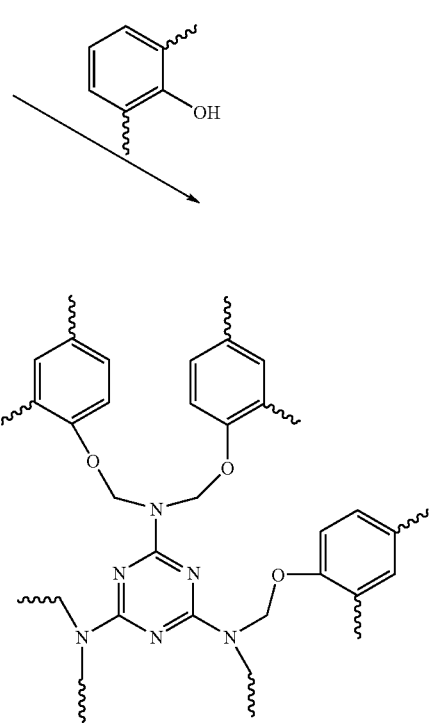

The latent crosslinker of this invention may be a single compound, an oligomer, a polymer, or mixtures thereof each containing at least two —N(CH$_2$OR)$_n$ groups. Such crosslinking agents may be prepared by the reaction of a variety of polyamino compounds with formaldehyde in the presence of alcohols such as methanol or butanol or in other solvents followed by an etherification step. Examples of suitable polyamino compounds include ureas, melamines, benzoguanamines, glycolurils, diguanamines, as described in U.S. Pat. No. 5,545,702, and guanidines.

Examples of suitable classes of such latent crosslinkers include but are not limited to the alkoxymethylmelamines, the alkoxyamethylglycolurils, the alkoxymethylbenzoguanamines, the alkoxymethyldiguanamines derived from diguanamines as described in U.S. Pat. No. 5,545,702, and melamine or benzoguanamine polymers as described in U.S. Pat. No. 6,524,708. Specific examples of compounds having multiple —N—(CH$_2$—OR)$_n$ units include but are not limited to:

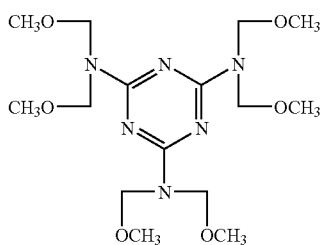
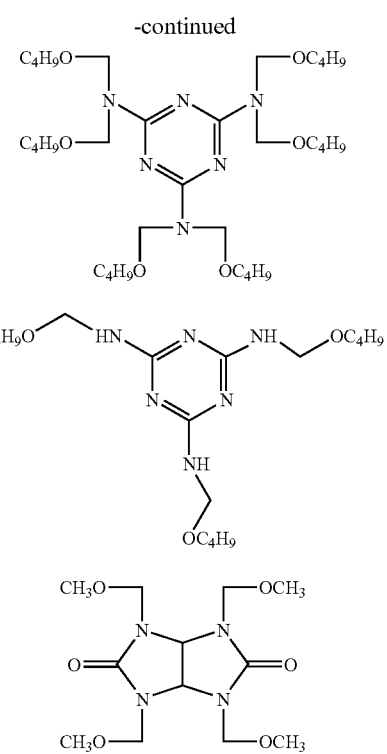

-continued

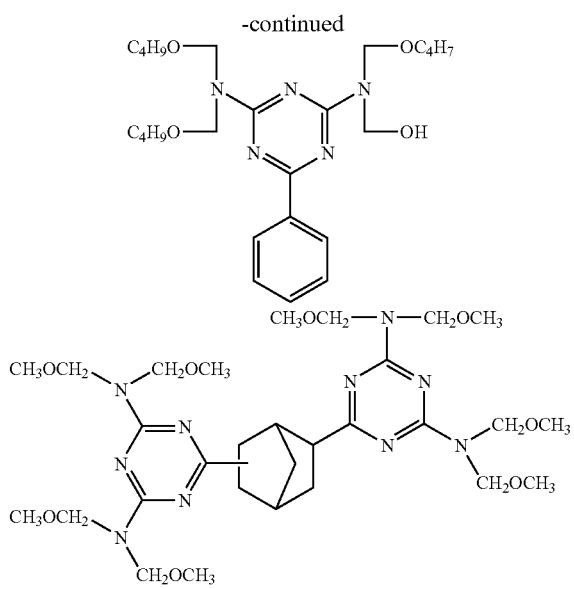

Materials having —N—(CH$_2$—OR)$_n$ units are available commercially from Cytec Industries, and Solutia as the Cymel, Powderlink, and Resimene series of products.

When the latent crosslinker is highly reactive, the dissolution rate modifier should not contain carboxylic acid groups. The carboxylic acid groups help catalyze undesired crosslinking during the initial bake to remove solvent. This results in a low dissolution rate in the unexposed areas following lithographic processing and poorer imaging properties. In this context, a highly reactive crosslinker is defined as one which crosslinks enough during the intial bake to decrease the dissolution rate to <1 micron/minute when baked at 100° C. for 60 seconds on a hotplate. Some melamine type crosslinkers e.g. Cymel 303 are typical examples of highly reactive crosslinkers.

Other embodiments of the invention may use crosslinkers of low reactivity. To avoid poor photospeed and lithographic properties, higher bake temperature are preferred. However, those skilled in the art may will recognize that PAGs of proper thermal stability must be chosen to avoid degradation of the lithographic properties caused by acid generation from thermal decomposition of the PAG. In a preferred embodiment, photosensitive compositions employing low reactivity crosslinkers also employ a dissolution rate modifier which contains carboxylic acids. Examples of low reactivity crosslinkers in this context include glyoluracils, e.g. Powderlink.

The dissolution modifier is added to increase the dissolution rate in unexposed areas, promote crosslinking and improve the overall performance of the formulation. The examples of dissolution modifiers include, but are not limited to, polyols, phenolic compounds with at least two hydroxyl groups, and compounds containing carboxylic acids.

Polyols are linear, cyclic or alicyclic aliphatic materials, which have more than one hydroxy group. In addition such materials can also contain heteroatoms such as oxygen or nitrogen. Examples of polyols include, but not limited to, ethylene glycol, diethylene glycol, polyethylene glycol, propylene glycol, tripropylene glycol, polypropylene glycol, glycerol, butane diol, hexane diol, sorbitol, cyclohexanediol, 4,8-bis(hydroxymethyl)-tricyclo(5.2. 1.0/2,6)decane and a 2-oxepanone co-polymer with 2-ethyl-2-(hydroxymethyl)-1,3-propanediol.

Phenolic compounds with at least two hydroxyl groups are materials containing at least two hydroxyl groups attached to the same or different aromatic rings. The aromatic rings can be fused, connected directly or connected through one or several carbon atoms. In addition to hydroxyl groups, these aromatic rings can have other substituents such as alkyl, ether or ester groups. The molecular weight of these materials can range from about 100 to 30,000. Examples of such materials include but are not limited to: hydroquinone, 1,1,1-tris(4-hydroxyphenyl)ethane, anthrarobin, 2,7-dihydroxynaphthalene, 4,4-biphenol, 3-methoxycatechol, poly(hydroxystyrene), novolacs, and calixarenes.

The dissolution rate modifier may contain compounds containing carboxylic acid groups. Such compounds can be monomeric or polymeric in nature and contain aromatic or aliphatic moieties. Examples of such compounds include, but are not limited to the following structures:

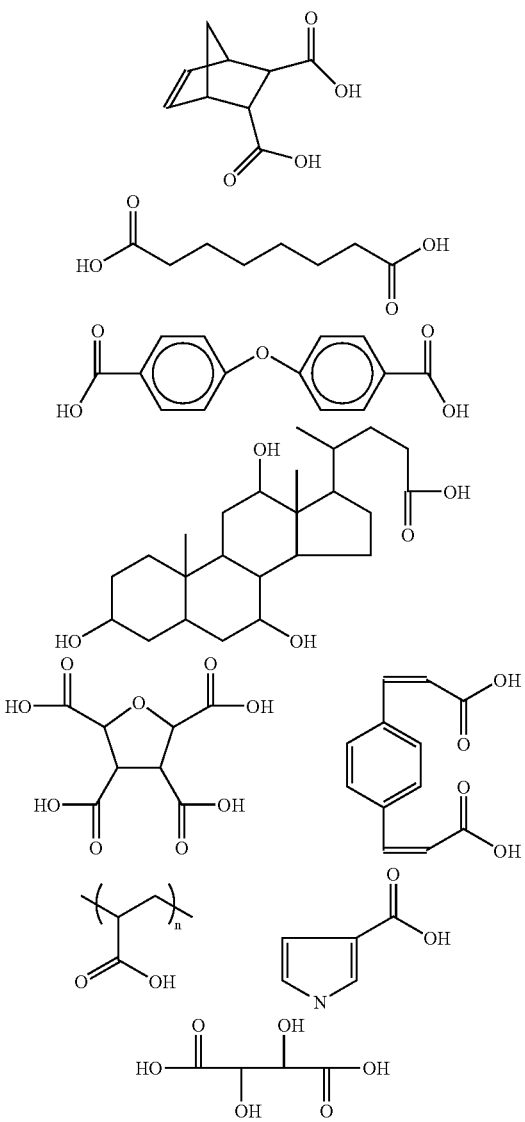

-continued

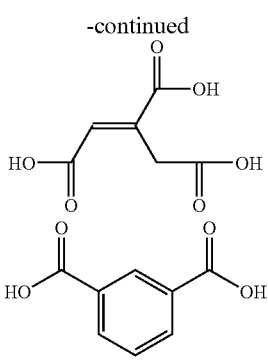

A preferred class of carboxylic acids in the present invention is polyamic acids. A preferred polyamic acid has structure (VII):

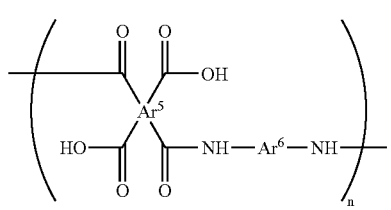

VII where n is an integer ranging from about 5 to about 200, and $Ar^5$ and $Ar^6$ can independently be aromatic or aliphatic, and preferably $Ar^6$ is a divalent aromatic group, a divalent heterocyclic group, a divalent alicyclic group, a divalent aliphatic group that may contain silicon, or mixtures thereof, and $Ar^5$ is a tetravalent aromatic group, a tetravalent heterocyclic group, a tetravalent cycloaliphatic group, or a tetravalent alicyclic group, with the proviso that each valence has at least one of the other valences ortho to it. A preferred range for n is from about 25 to about 175. A most preferred range for n is from about 50 to about 150. Polymer VII should be compatible with other components of the negative-working photosensitive composition and be soluble in the aqueous developer.

Examples of polymers having structure VII are prepared by reacting monomers VII and IX, where $Ar^5$ and $Ar^6$ can independently be aromatic or aliphatic

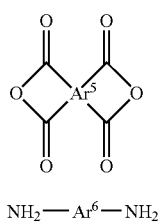

VIII

NH$_2$—Ar$^6$—NH$_2$

IX moieties with or without heteroatoms, and preferably $Ar^6$ is a divalent aromatic group, a divalent heterocyclic group, a divalent alicyclic group, a divalent aliphatic group that may contain silicon, or mixtures thereof, and $Ar^5$ is a tetravalent aromatic group, a tetravalent heterocyclic group, a tetravalent cycloaliphatic group, or a tetravalent alicyclic group, with the proviso that each valence has at least one of the other valences ortho to it. VII can be a dianhydride of one type or a mixture of several dianhydrides, provided that the final polymer is soluble in the photosensitive composition solvent. Examples of VII include, but are not limited to, the following dianydrides: 3,3',4,4'-biphenyltetracarboxylic acid dianhydride, 3,3',4,4' diphenylsulfidetetracarboxylic acid dianhydride, 3,3',4,4'-diphenylsulfontetracarboxylic acid dianhydride, 3,3',4,4'-benzophenone tetracarboxylic acid dianhydride, 3,3',4,4'-diphenylmethanetetracarboxylic acid dianhydride, 2,2',3,3'-diphenylmethanetetracarboxylic acid dianhydride, 2,3,3',4'-biphenyltetracarboxylic acid dianhydride, 2,3,3',4'-benzophenonetetracarboxylic acid dianhydride, dianhydrides of oxydiphthalic acids, particularly 3,3',4,4'-diphenyloxidetetracarboxylic acid dianhydride (4,4'-oxydiphthalic acid dianhydride), 2,3,6,7-naphthalenetetracarboxylic acid dianhydride, 1,4,5,7-naphtnalenetetracarboxylic acid dianhydride, 2,2-bis(3,4-dicarboxyphenyl)propane dianhydride, 2,2-bis(2,3-dicarboxyphenyl)propane dianhydride, 2,2-bis(3,4-dicarboxyphenyl)hexafluoropropane dianhydride, 1,3-diphenylhexafluoropropane-3,3,4,4-tetracarboxylic acid dianhydride, 1,4,5,6-naphthalenetetracarboxylic dianhydride, 2,2',3,3'-diphenyltetracarboxylic acid dianhydride, 3,4,9,10-perylenetetracarboxylic acid dianhydride, 1,2,4,5 naphthalenetetracarboxylic acid dianhydride, 1,4,5,8-naphthalenetetracarboxylic acid dianhydride, 1,8,9,10-phenanthrenetetracarboxylic acid dianhydride, 1,1-bis(2,3-dicarboxyphenyl)ethane dianhydride, 1,1-bis(3,4-dicarboxyphenyl)ethane dianhydride, 1,2,3,4-benzenetetracarboxylic acid dianhydride. Mixtures of dianhydrides, such as those named, may also be used.

In a preferred embodiment, dianhydride (VIII) comprises at least one material having one of the structures (X–XII):

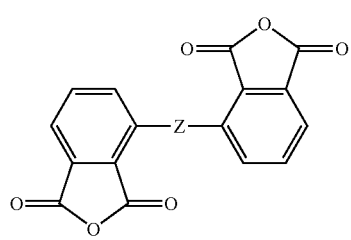

X

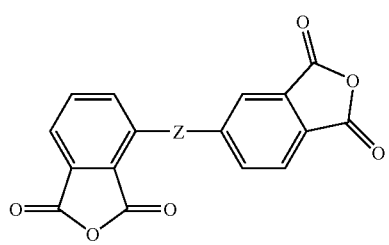

XI

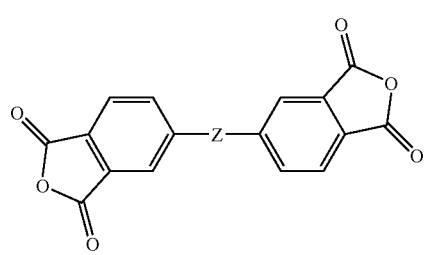

XII where Z=—O—, —S—, —C(CF$_3$)$_2$—, —CH$_2$—, —SO$_2$—, —NHCO— or —Si(R$^{11}$)$_2$— (R$^{11}$ is a liner branched or cyclic alkyl group containing up to 8 carbon atoms) In another preferred embodiment, Z=—O—.

In a more preferred embodiment, at least 80% of the total amount of dianhydride of Formula VII comprises anhydrides described by structures X–XII where Z=—O—. In the most preferred embodiments, the dianhydride of VII are 3,3',4,4'-diphenyloxidetetracarboxylic acid dianhydride (4,4'-oxydiphthalic acid dianhydride, ODPA) or mixture of 95–85% of ODPA and 5–15% of 1,2,4,5 benzenetetracarboxylic dianhydride (PMDA).

The diamine monomer of structure IX can be a single diamine or a mixture of two or more diamines provided that the final polymer is soluble in the photosensitive composition solvent. Examples of IX include, but are not limited to, the following diamines, which can be used individually or as a part of mixture: 5(6)-diamino-1-(4-aminophenyl)-1,3,3-trimethylindane (DAPI), m-phenylenediamine, p-phenylenediamine, 2,2'-bis(trifluoromethyl)-4,4'-diamino-1,1'-biphenyl, 3,4'-diaminodiphenyl ether, 4,4'-diaminodiphenyl ether, 3,3'-diaminodiphenyl ether, 2,4-tolylenediamine, 3,3'-diaminodiphenyl sulfone, 3,4'-diaminodiphenyl sulfone, 4,4'-diaminodiphenyl sulfone, 3,3'-diaminodiphenylmethane, 4,4'-diaminodiphenylmethane, 3,3'-diaminodiphenylmethane, 3,4'-diaminodiphenylmethane, 4,4'-diaminodiphenyl ketone, 3,3'-diaminodiphenyl ketone, 3,4'-diaminodiphenyl ketone, 1,3-bis (4-aminophenoxy) benzene, 1,3-bis(3-aminophenoxy) benzene, 1,4-bis (γ-aminopropyl)tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 2,5-dimethylnonamethylenediamine, decamethylenediamine, ethylenediamine, propylenediamine, 2,2-dimethylpropylenediamine, 1,10-diamino-1,10-dimethyldecane, 2,11-diaminidodecane, 1,12-diaminooctadecane, 2,17-diaminoeicosane, 3,3'-dimethyl-4,4'-diaminodiphenylmethane, bis(4-aminocyclohexyl)methane, bis(3-aminonorbornyl)methane, 3,3'-diaminodiphenylethne, 4,4'-diaminodiphenylethne, and 4,4'-diaminodiphenyl sulfide, 2,6-diaminopyridine, 2,5-diaminopyridine, 2,6-diamino-4-trifluoromethylpyridine, 2,5-diamino-1,3,4,-oxadiazole, 1,4-diaminocyclohexane, piperazine, 4,4'-methylenedianiline, 4,4'-methylene-bis(o-choloroaniline), 4,4'-methylene-bis(3-methylaniline), 4,4'-methylene-bis(2-ethylaniline), 4,4'-methylene-bis(2-methoxyaniline), 4,4'-oxy-dianiline, 4,4'-oxy-bis-(2-methoxyaniline), 4,4'-oxy-bis-(2-chloroaniline), 4,4'-thio-dianiline, 4,4'-thio-bis-(2-methylaniline), 4,4'-thio-bis-(2-methyoxyaniline), 4,4'-thio-bis-(2-chloroaniline), 3,3'sulfonyl-dianiline, 3,3'sulfonyl-dianiline, and mixtures thereof.

In a more preferred embodiment, diamine (IX) comprises at least one compound with the structure (XIII)

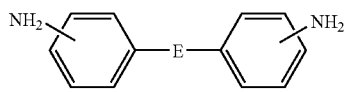

XIII where E=—O—, —S—, —C(CF$_3$)$_2$—, —CH$_2$—, —SO$_2$—, —NHCO— or —Si(R$^{11}$)$_2$— (R$^{11}$ is linear branched or cyclic alkyl group containing up to 8 carbon atoms).

A diamine described by structure XII where E is —O— is a preferred diamine. In a more preferred embodiment this diamine comprises more than 80% of the total amount of diamine IX. The most preferred diamine IX is 4,4'-diaminodiphenyl ether.

A preferred polyamic acid polymer of structure VII comprises a polymer synthesized from a dianhydride or dianhydrides of structure X, XI or XII and a diamine or diamines of structure IX. A more preferred polyamic acid polymer comprises a polyamic acid polymer synthesized from a dianhydride or dianhydrides of structure X, XI or XII where Z=—O— and a diamine or diamines of structure IX where E=—O—. Examples of preferred polymers of the present invention are polyamic acid polymers synthesized from 4,4'-diaminodiphenyl ether and 3,3',4,4'-diphenyloxidetetracarboxylic acid dianhydride (4,4'-oxydiphthalic acid dianhydride, ODPA) and a polyamic acid polymer synthesized from 4,4'-diaminodiphenyl ether and a mixture of 95–85% of ODPA and 5–15% of 1,2,4,5-benzenetetracarboxylic dianhydride (PMDA).

Polymers having structure VII are prepared by reacting monomers VIII and IX. The ratio of IX/VIII may be from about 0.90 to about 1. A preferred ratio of IX/VIII is from about 0.92 to about 0.99. A more preferred ratio of IX/VIII is from about 0.95 to about 0.98. The reaction time is from about an hour to about 48 hours. A preferred reaction time is from about 2 hours to about 24 hours. A more preferred reaction time is from 6 hours to 20 hours. The reaction temperature is from about −20° C. to about 60° C. A preferred reaction temperature is from about −10° C. to about 50° C. A more preferred reaction temperature is from about 0° C. to about 45° C. The polyamic acid can be prepared in situ and the solution added to the composition or it can be first isolated by precipitation into a non-solvent. Examples of suitable non-solvents include de-ionized water or a mixture of de-ionized water and an alcohol such as methanol or isopropyl alcohol. The ratio of de-ionized water to alcohol can vary from about 99/1 to about 10/90. A more preferred ratio of de-ionized water to alcohol is from about 90/10 to about 25/75. A more preferred ratio is from about 75/25 to about 25/75.

The polybenzoxazole precursor polymer(s), the photoactive agent(s), the crosslinker(s), and the dissolution rate modifier(s) are dissolved in a solvent(s) to prepare the negative working, photosensitive composition of this invention. The solvent should not interfere with the photoacid generation from PAG or with the acid-catalyzed crosslinking reaction, should dissolve all components and should cast a good film. Suitable solvents include, but are not limited to, polar organic solvents, such as gamma-butyrolactone (GBL), propylene glycol methyl-ether acetate (PGMEA), methoxy ethyl ether and mixtures thereof. The preferred solvent is gamma-butyrolactone.

The amount of polybenzoxazole precursor polymer (I) in the photosensitive composition of the present invention can range from about 10 wt % to about 50 wt % of total formulation. In a preferred embodiment, the content of (I) is from about 25 wt % to about 40 wt %. In a more preferred embodiment, the content of (I) is from about 25 wt % to about 35 wt % of total formulation.

The amount of PAG in the photosensitive composition of the present invention ranges from about 0.5 to 20 wt % based on amount of the polybenzoxazole precursor polymer. A preferred concentration range of PAG is from about 2 to about 15 wt % based on the amount of polybenzoxazole precursor polymer. A more preferred concentration range of PAG is from about 2.5 to about 10 wt % based on the amount of polybenzoxazole precursor polymer. A most preferred concentration range of PAG is from about 3 to about 7 wt % based on the amount of polybenzoxazole precursor polymer. The amount of optional sensitizer can be from about 0.1 to about 5 wt % based on the amount of polybenzoxazole precursor polymer.

The amount of latent crosslinker in the photosensitive composition of the present invention can be about 2 to about 35 wt % based on amount of polybenzoxazole precursor polymer. A preferred amount of crosslinker is from about 5 to about 25 wt % based on the amount of polybenzoxazole precursor polymer. A more preferred concentration range of crosslinker is from about 5 to about 20 wt % based on the amount of polybenzoxazole precursor polymer. A most preferred concentration range of crosslinker is from about 5 to about 15 wt % based on the amount of polybenzoxazole precursor polymer.

The amount of dissolution rate modifier can be from about 1 wt % to about 20 wt % based on the amount of polybenzoxazole precursor polymer. If a polyol compound is employed, a preferred amount is from about 5 wt % to about 20 wt % based on the amount of polybenzoxazole precursor polymer. A more preferred amount of polyol compound is from about 5 wt % to about 15 wt % based on the amount of polybenzoxazole precursor polymer. A most preferred amount of polyol compound is from about 8 wt % to about 12 wt % based on the amount of polybenzoxazole precursor polymer. If a phenolic compound is employed, a preferred amount is from about 5 wt % to about 20 wt % based on the amount of polybenzoxazole precursor polymer. A more preferred amount of phenolic compound is from about 5 wt % to about 15 wt % based on the amount of polybenzoxazole precursor polymer. A most preferred amount of phenolic compound is from about 8 wt % to about 12 wt % based on the amount of polybenzoxazole precursor polymer. If a compound containing carboxylic acid groups is employed, then a preferred amount is from about 2 wt % to about 15 wt % based on the amount of polybenzoxazole precursor polymer. A more preferred amount of carboxylic acid compound is from about 2% to about 10% based on the amount of polybenzoxazole precursor polymer. A most preferred amount of carboxylic acid compound is form about 2 wt % to about 5 wt % based on the amount of polybenzoxazole precursor polymer.

The amount of solvent in the formulation of the photosensitive composition of the invention can be from about 45 wt % to about 87 wt % of the total weight. A preferred amount is from about 50 to about 65 wt %.

The negative working photosensitive composition of the present invention can also contain other additives. Examples of suitable additives include, but are not limited to, dyes, surfactants and adhesion promoters.

If employed, the amount of adhesion promoter may range from about 0.1 wt. % to about 5 wt. % based on the amount of polybenzoxazole precursor polymer. A preferred amount of adhesion promoter is from about 1 wt. % to about 5 wt. % based on the amount of polybenzoxazole precursor polymer. A more preferred amount of adhesion promoter is from about 2 wt. % to about 4 wt. % based on the amount of polybenzoxazole precursor polymer. Suitable adhesion promoters include, for example, amino silanes, and mixtures or derivatives thereof. Examples of suitable adhesion promoters which may be employed in the invention may be described by Structure XIV

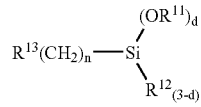

(XIV)

wherein each $R^{11}$ is independently a $C_1$–$C_4$ alkyl group or a $C_5$–$C_7$ cycloalkyl group and each $R^{12}$ is independently a $C_1$–$C_4$ alkyl group, a $C_1$–$C_4$ alkoxy group, a $C_5$–$C_7$ cycloalkyl group or a $C_5$–$C_7$ cycloalkoxy group; d is an integer from 0 to 3 and n is an integer from 1 to about 6. $R^{13}$ is one of the following moieties:

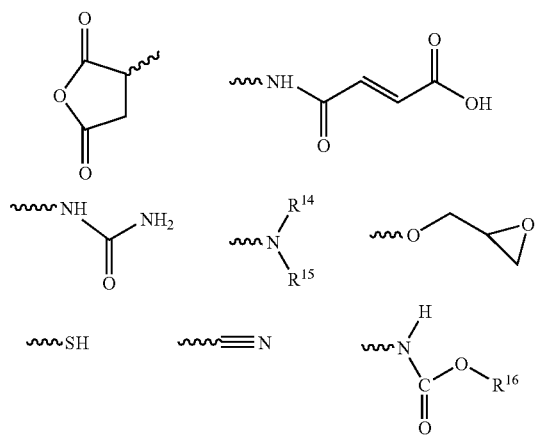

wherein each $R^{14}$ and $R^{15}$ are independently a substituted or unsubstituted $C_1$–$C_4$ alkyl group or a $C_5$–$C_7$ cycloalkyl group, and $R^{16}$ is a $C_1$–$C_4$ alkyl group and a $C_5$–$C_7$ cycloalkyl group. Preferred adhesion promoters are those wherein $R^{13}$ are

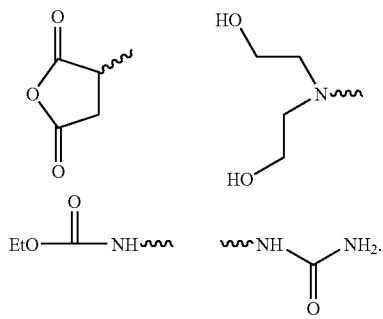

More preferred adhesion promoters are those selected from the group consisting of

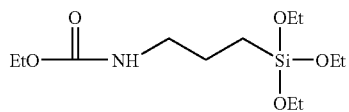

-continued

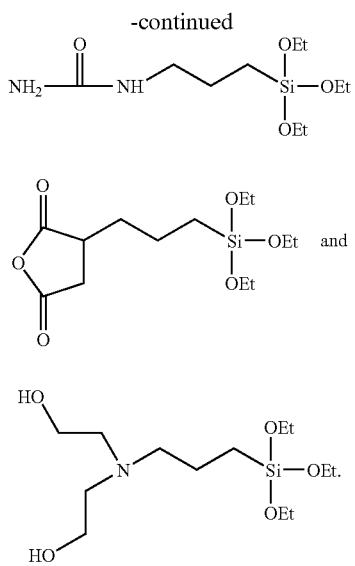

In addition, the present invention includes a process for forming a negative tone relief image. The process comprises the steps of:

(a) providing a substrate,
(b) coating on said substrate, a negative-working photosensitive composition comprising one or more polybenzoxazole precursors having the structure (I),

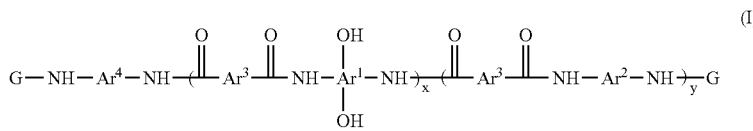

wherein $Ar^1$, $Ar^2$, $Ar^3$, and G are as defined above; one or more photo-active compounds which release acid upon irradiation, one or more latent crosslinkers each of which contains at least two ~N—$(CH_2OR)_n$ units where n=1 or 2, and wherein R is a linear or branched $C_1$–$C_8$ alkyl group), at least one solvent and at least one dissolution rate modifier (all as described above), with the proviso that when the latent crosslinker is highly reactive, the dissolution rate modifier does not contain carboxylic acid groups, thereby forming a coated substrate;

(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

Examples of suitable substrates include, but are not limited to, silicon wafers, compound semiconductor (III–V) or (II–VI) wafers, glass, quartz or ceramic substrates, or the like. Coating methods include, but are not limited to, spray coating, spin coating, offset printing, roller coating, screen printing, extrusion coating, meniscus coating, curtain coating, and immersion coating.

To ensure proper adhesion of the photosensitive composition to the substrate the substrate may be optionally treated before coating with an (external) adhesion promoter before the first coating step or the photosensitive composition may employ an internal adhesion promoter. Any suitable method of treatment of the substrate with adhesion promoter known to those skilled in the art may be employed. Examples include treatment of the substrate with adhesion promoter vapors, solutions or at 100% concentration. The time and temperature of treatment will depend on the particular substrate, adhesion promoter, and method, which may employ elevated temperatures. Any suitable external adhesion promoter may be employed. Classes of suitable external adhesion promoters include but are not limited to vinylalkoxysilanes, methacryloxalkoxyysilanes, mercaptoalkoxysilanes, aminoalkoxysilanes, epoxyalkoxysilanes and glycidoxyalkoxysilanes. Aminosilanes and glycidoxysilanes are more preferred. Primary aminoalkoxysilanes are more preferred. Examples of suitable external adhesion promoters include, but are not limited to gamma-aminopropyltrimethoxy-silane, gamma-glycidoxypropylmethyldimethoxysilane, gamma-glycidoxypropylmethyldiethoxysilane, gamma-mercaptopropylmethyldimethoxysilane, 3-methacryloxypropyldimethoxymethylsilane, and 3-methacryloxypropyltrimethoxysilane. gamma-Aminopropyltrimethoxysilane is more preferred. Additional suitable adhesion promoters are described in "Silane Coupling Agent" Edwin P. Plueddemann, 1982 Plenum Press, New York.

The resulting film is optionally prebaked at an elevated temperature. The bake may be completed at one or more temperatures within the temperature bake of from about 70° C. to about 150° C. for several minutes to half an hour, depending on the method, to evaporate the remaining solvent. Any suitable baking means may be employed. Examples of suitable baking means include, but are not limited to, hot plates and convection ovens.

Subsequently, the resulting film is exposed to actinic rays in a preferred pattern through a mask. X-rays, electron beam, ultraviolet rays, visible light, and the like can be used as actinic rays. The most preferable rays are those with wavelength of 436 nm (g-line) and 365 nm (i-line).

Following exposure to actinic radiation, the exposed and coated substrate is heated to a temperature between about 70° C. and about 150° C. The exposed and coated substrate is heated in this temperature range for a short period of time, typically several seconds to several minutes and may be carried out using any suitable heating means. Preferred means include baking on a hot plate or in a convection oven. This process step is commonly referred to in the art as post exposure baking.

Next, the film is developed using an aqueous developer and a relief pattern is formed. The aqueous developer contains aqueous base. Examples of suitable bases include, but are not limited to, inorganic alkalis (e.g., potassium hydroxide, sodium hydroxide, ammonia water), primary amines (e.g., ethylamine, n-propylamine), secondary amines (e.g. diethylamine, di-n-propylamine), tertiary amines (e.g., triethylamine), alcoholamines (e.g. triethanolamine), quaternary ammonium salts (e.g., tetramethylammonium hydroxide, tetraethylammonium hydroxide), and mixtures thereof. The concentration of base employed will vary depending on the base solubility of the polymer employed and the specific base employed. The most preferred developers are those containing tetramethylammonium hydroxide (TMAH). Suitable concentrations of TMAH range from about 1% to about 5%. In addition, an appropriate amount of a surfactant can be added to the developer. Development can be carried out by means of immersion, spray, puddling, or other similar developing methods at temperatures from about 10° C. to 40° C. for about 30 seconds to about 5 minutes. After development, the relief pattern may be optionally rinsed using de-ionized water and dried by spinning, baking on a hot plate, in an oven, or other suitable means.

The benzoxazole ring is then formed by curing of the uncured relief pattern to obtain the final high heat resistant pattern. Curing is performed by baking the developed, uncured relief pattern at, or above, the glass transition temperature Tg of the photosensitive composition to obtain the benzoxazole ring that provides high heat resistance. Typically, temperatures above about 200 C are used. Preferably, temperatures from about 250° C. to about 400° C. are applied. The curing time is from about 15 minutes to about 24 hours depending on the particular heating method employed. A more preferred range for the curing time is from about 20 minutes to about 5 hours and the most preferred range of curing time is from about 30 minutes to about 3 hours. Curing can be done in air or preferably under a blanket of nitrogen and may be carried by any suitable heating means. Preferred means include baking on a hot plate or in a convection oven.

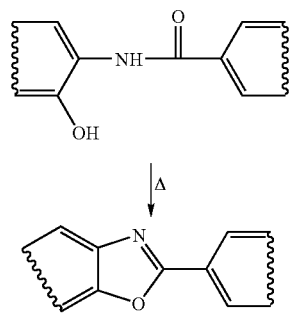

Formation of polybenzoxazole ring

The application of the said polybenzoxazole relief images in semiconductor industry include, but are not limited to, stress relief coatings for packaged semiconductors, alpha particle barrier films, interlevel dielectrics, insulating films and patterned engineering plastic layers. The present invention includes articles of commerce. Examples of articles of commerce made using the disclosed formulation and method include, but not limited to memory devices, such as DRAMs, logic devices, such as microprocessors or microcontrollers, plating stencils, etc.

To illustrate the present invention, the following examples are provided. It should be understood that the present invention is not limited to the examples described.

SYNTHETIC EXAMPLE 1

Preparation of PBO Precursor Polymer with Amino End Groups (Va)

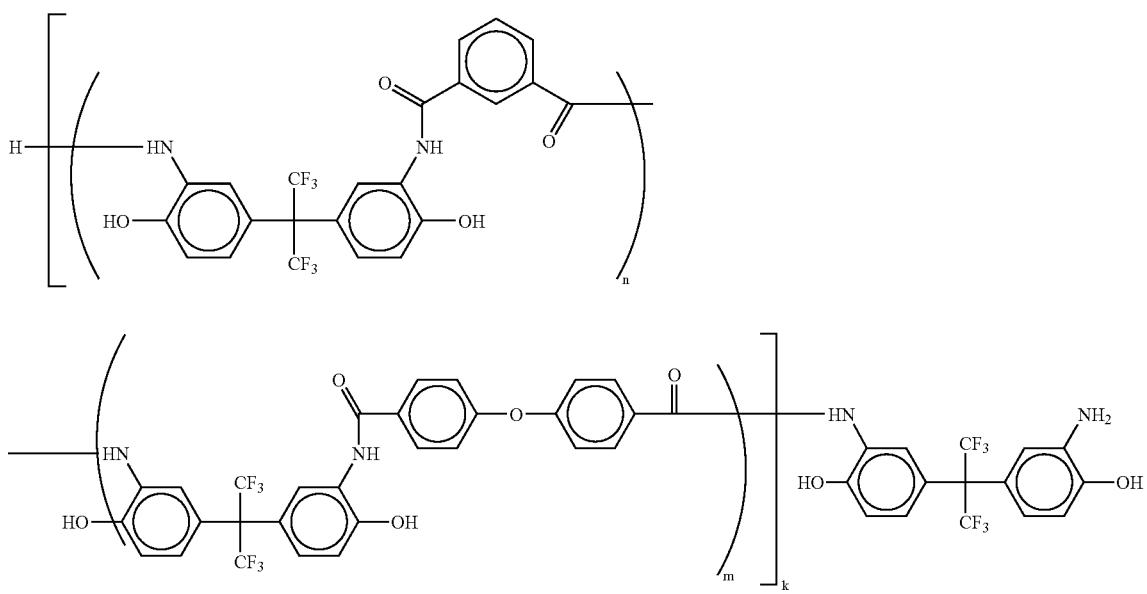

To a 2 L, three-necked, round bottom flask equipped with a mechanical stirrer, nitrogen inlet and addition funnel, 155.9 g (426.0 mmol) of hexafluoro-2,2-bis(3-amino-4-hydroxyphenyl)propane, 64.3 g (794.9 mmol) of pyridine, and 637.5 g of N-methyl-2-pyrrolidone (NMP) were added. The solution was stirred at room temperature until all solids dissolved and then cooled in an ice water bath at 0–5° C. To this solution, 39.3 g (194 mmol) of isophthalyl chloride, and 56.9 g (194 mmol) of 1,4-oxydibenzoyl chloride dissolved in 427.5 g of NMP, were added drop-wise. After the addition was completed, the resulting mixture was stirred at room temperature for 18 hours. The viscous solution was precipitated in 10 liters of vigorously stirred de-ionized water. The polymer was collected by filtration and washed with de-ionized water and a water/methanol (50/50) mixture. The

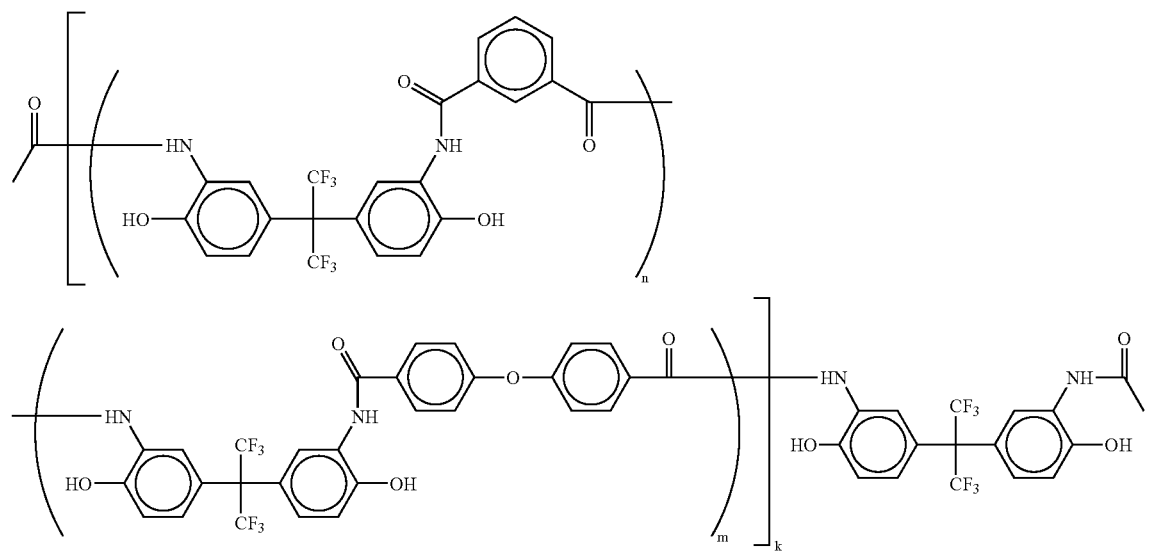

polymer was dried under vacuum conditions at 105° C. for 24 hours. The yield was almost quantitative.

The inherent viscosity (IV) of the polymer was 0.20 dL/g measured in NMP at a concentration of 0.5 g/dL at 25° C. The number average molecular weight (Mn) was determined by gel permeation chromatography using four Phenogel 10 columns with pore sizes of $10^4$ A, 500 A, 100 A and 50 A and THF as an eluent. Polystyrene standards were used for calibration. The typical Mn for a polymer prepared by the above procedure was 5,800. The average molecular weight of the repeat unit is about 540, so the degree of polymerization (x+y, y=0) was determined to be about 11.

SYNTHETIC EXAMPLE 2

Preparation of PBO Precursor Polymer of Structure Va with Alternative Monomer Ratio (Vb)

To a 100 mL three-necked round bottom flask equipped with a mechanical stirrer, nitrogen inlet and addition funnel, 3.66 g (10 mmol) of hexafluoro-2,2-bis(3-amino-4-hydroxyphenyl)propane, 1.70 g (21 mmol) of pyridine and 15 g of N-methyl-2-pyrrolidone (NMP) were added. The solution was stirred at room temperature until all solids dissolved and then cooled in an ice water bath at 0–5° C. To this solution, 1.01 g (5 mmol) of isophthaloyl chloride and 1.477 g (5 mmol) of 1,4-oxydibenzoyl chloride dissolved in 10 g of NMP was added drop-wise. After the addition was completed, the resulting mixture was stirred at room temperature for 18 hours. The viscous solution was precipitated in 800 mL of vigorously stirred de-ionized water. The polymer was collected by filtration and washed with de-ionized water and a water/methanol (50/50) mixture. The polymer was dried under vacuum at 105° C. for 24 hours. The yield was almost quantitative and the inherent viscosity of the polymer was 0.36 dL/g measured in NMP at the concentration of 0.5 g/dL at 25° C.

SYNTHETIC EXAMPLE 3

Preparation of PBO Precursor Polymer (Ia) with G=acetyl

The PBO polymer obtained in Synthetic Example 2 (100 g) was dissolved in 1000 g of Diglyme. Residual water was removed as an azeotrope with Diglyme using a rotary evaporator at 65° C. (10–12 torr). About 500 g of solvent was removed during the azeotropic distillation. The reaction solution was placed under a $N_2$ blanket, equipped with a magnetic stirrer and cooled using an ice bath down to ~5° C. Acetyl chloride (3.3 ml, 3.6 g) was added via syringe. The reaction was held on the ice bath for about 10 min. Then the ice bath was removed and the reaction was allowed to warm up over the period of 1 hr. Then, the mixture was again cooled to 5° C. on the ice bath. Pyridine (3.7 ml, 3.6 g) was added via syringe over the period of 1 hr. The reaction was kept on the ice bath for ~10 min following the pyridine addition, and then was allowed to warm up over the period of 1 hr.

The reaction mixture was precipitated into 6 L of water with stirring. The precipitated polymer was collected by filtration and air dried overnight. Then, the polymer was dissolved in 500–600 g of acetone and precipitated into 6 L of water/methanol (70/30). The polymer was again collected by filtration and air-dried for several hours. The still damp polymer cake was dissolved in a mixture of 700 g of THF and 70 ml of water. An ion exchange resin UP604 (40 g), available from Rohm and Haas, was added and the solution was rolled for 1 hr. The final product was precipitated in 7 L of water, filtered, air-dried overnight followed by 24 hr drying in vacuum oven at 90° C. Yield: 100 g

SYNTHETIC EXAMPLE 4

Preparation of 4,4'-oxydiphthalic anhydride (ODPA)/oxydianiline (ODA) Polyamic Acid (VIIa)

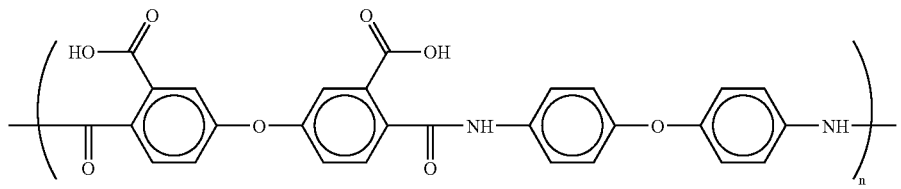

A 500 mL, three neck, round bottom flask was equipped with a mechanical stirrer, temperature controller and nitrogen inlet. 270 g of gamma-butyrolactone was added to this reaction flask followed by addition of 31.022 g (100 mmol) of 4,4'-oxydiphthalic anhydride (ODPA). The ODPA charging funnel was rinsed with 15 g of gamma-butyrolactone. The reaction mixture was stirred at room temperature for 15 minutes and then at 73–75° C. until 4,4'-oxydiphthalic anhydride was fully dissolved. The clear, pale yellow reaction solution was cooled to 15° C. The 4,4'-oxydiphthalic anhydride was partially precipitated. 19.62 g (98 mmol) of oxydianiline was added portion wise over the period of an hour. The oxydianiline container was rinsed with 13.3 g gamma-butyrolactone, which was then added to the reaction solution in one portion. The reaction temperature was kept at 15° C. for another 15 minutes and then slowly increased to 40° C. The reaction mixture was allowed to stir at this temperature for 24 hours. The reaction was complete as evidenced by the absence of an anhydride peak (1800 cm$^{-1}$) from the IR spectrum of the solution. The viscosity of the final product was 1384 cSt.

SYNTHETIC EXAMPLE 5

Preparation of 4,4'-oxydiphthalic anhydride (ODPA)/oxydianiline (ODA)/para-aminophenol Polyamic Acid (VIIb)

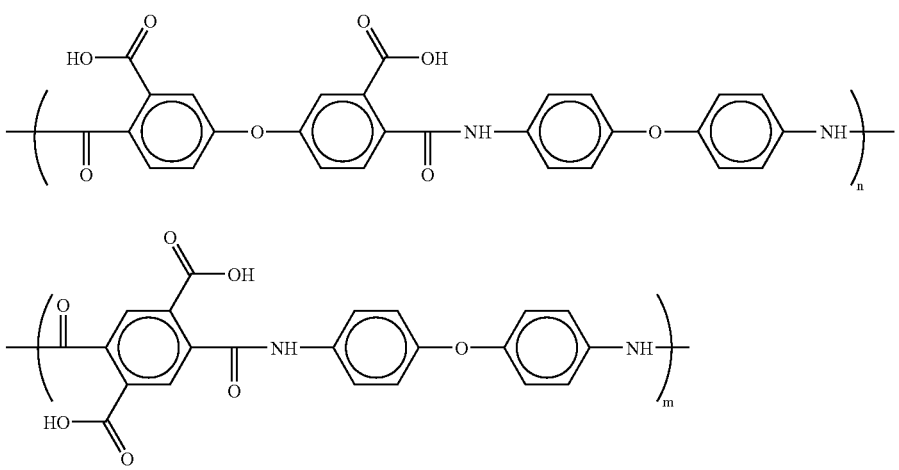

A 1000 mL, three neck, round bottom flask was equipped with a mechanical stirrer, temperature controller and nitrogen inlet. 531.8 g of gamma-butyrolactone was added to this reaction flask followed by addition of 62.05 g (100 mmol) of 4,4'-oxydiphthalic anhydride (ODPA). The reaction mixture was stirred at room temperature for 15 minutes and then at 73–75° C. until 4,4'-oxydiphthalic anhydride was fully dissolved. Para-aminophenol (0.437 g) was added to the flask and stirred for 6 hrs at 25° C. Then 19.62 g (98 mmol) of oxydianiline was added portion wise over the course of an hour. The reaction temperature was kept at 15° C. for another 15 minutes and then slowly increased to 40° C. The reaction mixture was allowed to stir at this temperature for 24 hours. The reaction was complete as evidenced by the absence of an anhydride peak (1800 cm$^{-1}$) from the IR spectrum of the solution. The viscosity of the final product was 1083 cSt.

SYNTHETIC EXAMPLE 6

Preparation of PBO Polymer End Capped with Nadic Anhydride (Ib)

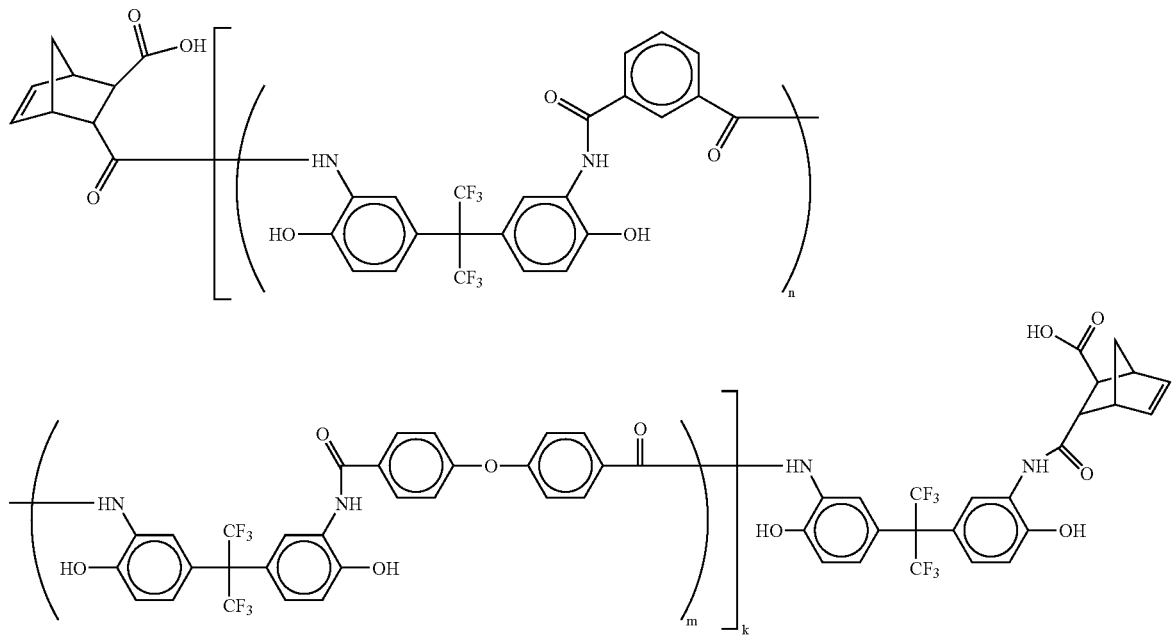

A PBO polymer prepared in the same way as in Example 2 (200 g) was dissolved in a mixture of 600 g of Diglyme and 300 g of propylene glycol methyl ether acetate (PGMEA). Residual water was removed as an azeotrope with PGMEA and Diglyme using a rotary evaporator at 65° C. (10–12 torr). About 550 g of solvents was removed during the azeotropic distillation. The reaction solution was placed under a N2 blanket and equipped with a magnetic stirrer. Nadic anhydride (7 g) was added followed by 10 g of Pyridine. The reaction was stirred overnight at 50° C. Then the reaction mixture was diluted with 500 g of tetrahydrofuran (THF) and precipitated into 8 L of a 50:50 methanol: water mixture. The polymer was collected by filtration and vacuum dried at 80° C. The yield was almost quantitative.

SYNTHETIC EXAMPLE 7

Preparation of 4,4'-(Hexafluoroisopropylidene)-Bis-(Phthalic Anhydride) (6-FDA)/oxydianiline (ODA) Polyamic Acid (VIIc)

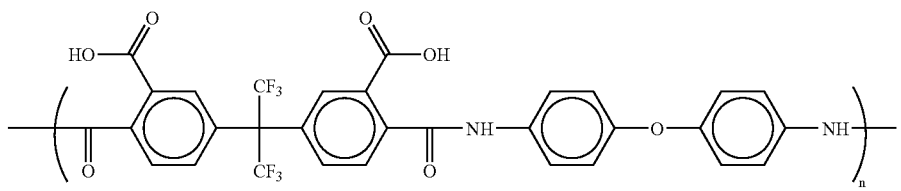

A 500 mL, three neck, round bottom flask was equipped with a mechanical stirrer, temperature controller and nitrogen inlet. 256 g of gamma-butyrolactone was added to this reaction flask followed by addition of 44.42 g (100 mmol) of 1,1-bis[4-(1,2-dicarboxyphenyl)]-1-phenyl-2,2,2-trifluoroethane (6-FDA). The reaction mixture was stirred at room temperature for 15 minutes and then at 60° C. until 6-FDA was fully dissolved. The clear, pale yellow reaction solution was cooled to 15° C. 19.62 g (98 mmol) of oxydianiline was added portion wise within an hour. The reaction temperature was kept at 15° C. for another 15 minutes and then slowly increased to 40° C. The reaction mixture was allowed to stir at this temperature for 24 hours. The viscosity of the final product was 4480 cSt. The solution was diluted with 75 g of GBL yielding 6-FDA/ODA polyamic acid solution in GBL with kinematic viscosity of 1029 cSt.

LITHOGRAPHIC EXAMPLE 1

DRM Study of PBO Polymer (I) with Different Dissolution Modifiers

Photosensitive formulation (A) was prepared by mixing together 100 parts by weight of a PBO precursor polymer, prepared in the same way as in Synthetic Example 3, 200 parts of GBL, 5 parts of (5-propylsulfonyloxyimino-5H-thiophen-2-ylidene)-2-methylphenyl-acetonitrile (available from Ciba Specialty Chemicals), 31.25 parts of ODPA/ODA polymer prepared in Synthetic Example 4 and 10 parts of Powderlink 1174, a crosslinker available from Cytec Industries, which contains tetramethyl methoxy glycoluril as an active component.

Photosensitive formulation (B) was prepared by mixing together 100 parts by weight of a PBO precursor polymer, prepared in the same way as in Synthetic Example 3 but with IV=0.28 dL/g, 200 parts of GBL, 5 parts of (5-propylsulfonyloxyimino-5H-thiophen-2-ylidene)-2-methylphenyl-acetonitrile, 10 part of diethyleneglycol and 5 parts of Cymel 303, a crosslinker available from Cytec Industries which contains hexamethyl methoxy melamine as an active component.

Photosensitive formulation (C) was prepared by mixing together 100 parts by weight of a PBO precursor polymer, prepared in the same way as in Synthetic Example 3 but with IV=0.28 dL/g, 200 parts of GBL, 5 parts of (5-propylsulfonyloxyimino-5H-thiophen-2-ylidene)-2-methylphenyl-acetonitrile, 10 parts of 1,1,1-Tris(4-hydroxyphenyl)ethane, available from Aldrich Chemicals, and 5 parts of Cymel 303.

Reference formulation (D) was prepared by mixing together 100 parts by weight of a PBO precursor polymer, prepared in the same way as in Synthetic Example 3, 200 parts of GBL, 5 parts of (5-propylsulfonyloxyimino-5H-thiophen-2-ylidene)-2-methylphenyl-acetonitrile, and 5 parts of Cymel 303.

Reference formulation (E) was prepared by mixing together 100 parts by weight of a PBO precursor polymer, prepared in the same way as in Synthetic Example 3 but with IV=0.28 dL/g, 200 parts of GBL, 5 parts of (5-propylsulfonyloxyimino-5H-thiophen-2-ylidene)-2-methylphenyl-acetonitrile, and 5 parts of Cymel 303.

Films of each of these compositions were prepared by spin coating onto silicon wafers and baking on a hotplate for 3 minutes at 120° C. to obtain a film of about 12 μm in thickness. To simulate film conditions and dissolution rates after post exposure bake during normal processing, the wafers were baked again at 120° C. for 3 min. The dissolution rates were determined by measuring the time required to dissolve the resist film in 0.262N aqueous TMAH solution and are summarized in

TABLE 1

| | Formulation | | | | |
|---|---|---|---|---|---|
| | A | B | C | D | E |
| PBO precursor (intrinsic viscosity dL/g)) | 0.37 | 0.28 | 0.28 | 0.37 | 0.28 |
| Dissolution rate (μ/min) | 7 μ/min | 9 μ/min | 10 μ/min | 2 μ/min | 5 μ/min |

This example illustrates that the addition of the dissolution rate modifier increases the dissolution rate of the unexposed photosensitive composition.

COMPARATIVE LITHOGRAPHIC EXAMPLE 1

Lithographic Evaluation of PBO Precursor Polymer (Va) without Dissolution Rate Modifier Comparative Photosensitive Formulation I was prepared by mixing together 100 parts by weight of a PBO precursor polymer, prepared in the same way as in Synthetic Example 1, 160 parts of GBL, 5 parts of (5-toluylsulfonyloxyimino-5H-thiophen-2-ylidene)-2-methylphenyl-acetonitrile and 10 parts of Powderlink 1174. The formulation was filtered through a 1 μm filter.

Comparative Photosensitive Formulation 1 was spin coated onto silicon wafers and baked on a hotplate for 3 minutes at 110° C. to obtain a film of about 10 μm in thickness. Then half of each wafer was flood exposed on a Karl Suss broadband exposure tool using a variable transmission mask. The exposed, coated wafers were baked again at 120° C. for 3 min. Then the wafers were immersed into a 0.262N aqueous TMAH solution. The dissolution rate was determined by dividing the film thickness by the time it took for exposed and unexposed part of the wafers to clear. There was no difference in dissolution rate in exposed and unexposed areas of the wafers. The dissolution rate in both cases was about 8 μ/min. This showed that there was no exposure related crosslinking at this post exposure bake temperature.

COMPARATIVE LITHOGRAPHIC EXAMPLE 2

Lithographic Evaluation of PBO Precursor Polymer (Ia) without Dissolution Rate Modifier Comparative Photosensitive Formulation 2 was prepared by mixing together 100 parts by weight of a PBO precursor polymer, prepared in the same way as in Synthesis Example 3 except with IV=0.2 dL/g, 160 parts of GBL, 5 parts of (5-toluylsulfonyloxyimino-5H-thiophen-2-ylidene)-2-methylphenyl-acetonitrile and 10 parts of Powderlink 1174. The formulation was filtered through a 1 μm filter.

Comparative Photosensitive Formulation 2 was spin coated onto silicon wafers and baked on a hotplate for 3 minutes at 110° C. to obtain a film of about 10 μm in thickness. Then half of each wafer was flood exposed on a Karl Suss broadband exposure tool using a variable transmission mask. The exposed, coated wafers were baked again at 120° C. for 3 min. Then the wafers were immersed into a 0.262N aqueous TMAH solution. The dissolution rate was determined by dividing the film—thickness by the—time it took for exposed and unexposed part of the wafers to dissolve. There was no difference in dissolution rate in exposed and unexposed areas of the wafers. The dissolution rate in both cases was about 8 μ/min. This showed that there was no exposure related crosslinking at this post exposure bake temperature.

LITHOGRAPHIC EXAMPLE 2

Lithographic Evaluation of PBO Precursor Polymer (Ia) with ODPA/ODA Polyamic Acid A photosensitive formulation was prepared by mixing together 100 parts by weight of a PBO precursor polymer, prepared in the same way as in Synthetic Example 3, 200 parts of GBL, 5 parts of (5-propylsulfonyloxyimino-5H-thiophen-2-ylidene)-2-methylphenyl-acetonitrile, 31.25 parts of ODPA/ODA polymer prepared in Synthetic Example 4 and 10 parts of Powderlink 1174. This composition was then spin coated onto a silicon wafer and baked on a hotplate for 3 minutes at 120° C. to obtain a film of about 12 μm in thickness. This film was exposed portion wise using incremental exposures on a Cannon 3000i4 exposure tool starting at 50 mJ/cm$^2$ incrementing the exposure dose by 50 mJ/cm$^2$. The coated, exposed wafer was then baked at 120° C. for 3 min, developed for 95 seconds under a continuous spray of 0.262N aqueous TMAH solution, and rinsed with de-ionized water to provide a relief pattern. At the exposure dose of 100 mJ/cm$^2$ 97% of the film was retained in the exposed areas and 10 μm features were resolved.

Adding the carboxylic acid containing dissolution rate modifier not only increased the dissolution rate of the unexposed areas, it also catalyzed the crosslinking at lower temperatures. Thus PAGs that might decompose at higher bake temperatures can be employed.

LITHOGRAPHIC EXAMPLE 3

Lithographic Evaluation of PBO Precursor Polymer (Ia) with ODPA/ODA/PAP Polyamic Acid A photosensitive formulation was prepared by mixing together 100 parts by weight of a PBO precursor polymer, prepared in the same way as in Synthetic Example 3, 200 parts of GBL, 5 parts of (5-propylsulfonyloxyimino-5H-thiophen-2-ylidene)-2-methylphenyl-acetonitrile, 31.25 parts of polyamic acid solution prepared in Synthetic Example 5 and 10 parts of Powderlink 1174.

This composition was then spin coated onto a silicon wafer and baked on a hotplate for 3 minutes at 120° C. to obtain a film of about 12 μm in thickness. This film was exposed portion wise using incremental exposures on a Cannon 3000i4 exposure tool starting at 50 mJ/cm$^2$ incrementing the exposure dose by 50 mJ/cm$^2$. The coated, exposed wafer was then baked at 120° C. for 3 min, developed for 95 seconds under a continuous spray of 0.262N aqueous TMAH solution, and rinsed with de-ionized water to provide a relief pattern. At the exposure dose of 50 mJ/cm$^2$ 97% of the film was retained in the exposed areas and 10 μm features were resolved.

LITHOGRAPHIC EXAMPLE 4

Lithographic Evaluation of PBO Precursor Polymer (Vb) with Two Dissolution Rate Modifiers.

A photosensitive formulation was prepared by mixing together 100 parts by weight of a PBO precursor polymer prepared in the same way as in Synthesis Example 2, 200 parts of GBL, 5 parts of (5-toluylsulfonyloxyimino-5H-thiophen-2-ylidene)-2-methylphenyl-acetonitrile (available from Ciba Specialty Chemicals), 31.3 parts of polyamic acid solution obtained from Synthetic Example 4, 10 parts of Powderlink 1174, 10 parts of a 2-oxepanone polymer with 2-ethyl-2-(hydroxymethyl)-1,3-propanediol (available from Arch Chemicals under the trade name Poly-T 305) and 3 parts of (triethoxysilyl)propylethylcarbamate (adhesion promoter).

The photosensitive composition was then spin coated onto a silicon wafer and baked on a hotplate for 3 minutes at 110° C. to obtain a film of about 12 μm in thickness. This film was exposed portion wise using incremental exposures on a Cannon 3000i4 exposure tool starting at 50 mJ/cm$^2$ and incrementing the exposure dose by 50 mJ/cm$^2$. The coated, exposed wafer was then baked at 120° C. for 3 min, developed using 0.262N aqueous TMAH developer solution (two puddle development steps, 30 sec each), and rinsed with de-ionized water to provide a relief pattern. At the exposure dose of 100 mJ/cm$^2$ 97% of the film was retained in the exposed areas and 30 μm features were resolved.

LITHOGRAPHIC EXAMPLE 5

Lithographic Evaluation of PBO Precursor Polymer (Ia) with Two Dissolution Rate Modifiers A photosensitive formulation was prepared by mixing together 100 parts by weight of a PBO precursor polymer prepared in the same way as Synthetic Example 3, 200 parts of GBL, 5 parts of (5-toluylsulfonyloxyimino-5H-thiophen-2-ylidene)-2-methylphenyl-acetonitrile, 31.3 parts of polyamic acid solution obtained in Synthetic Example 4, 10 parts of Powderlink 1174, 10 parts of 2-oxepanone polymer with 2-ethyl-2-(hydroxymethyl)-1,3-propanediol and 3 parts of (triethoxysilyl)-propylethylcarbamate.

The photosensitive formulation was then spin coated onto a silicon wafer and baked on a hotplate for 3 minutes at 110° C. to obtain a film of about 12 μm in thickness. This film was exposed portion wise using incremental exposures on a Cannon 3000i4 exposure tool starting at 50 mJ/cm$^2$ incrementing the exposure dose by 50 mJ/cm$^2$. The coated, exposed wafer was then baked at 120° C. for 3 min, developed using 0.262N aqueous-TMAH developer solution (two puddle development steps, 30 sec each), and rinsed with de-ionized water to provide a relief pattern. At the exposure dose of 100 mJ/cm$^2$ 97% of the film was retained in the exposed areas and 7 μm features were resolved.

LITHOGRAPHIC EXAMPLE 6

Lithographic Evaluation of PBO Precursor Polymer (Ia) with Two Dissolution Rate Modifiers A photosensitive formulation was prepared by mixing together 100 parts by weight of a PBO polymer prepared in the same way as in Synthetic Example 3, 200 parts of GBL, 5 parts of (5-toluylsulfonyloxyimino-5H-thiophen-2-ylidene)-2-methylphenyl-acetonitrile, 31.3 parts of polyamic acid solution obtained in Synthetic Example 4, 10 parts of Powderlink 1174, 10 parts of tripropylene glycol (available from Aldrich Chemicals) and 3 parts of (triethoxysilyl)propylethylcarbamate.

This photosensitive composition was then spin coated onto a silicon wafer and baked on a hotplate for 3 minutes at 120° C. to obtain a film of about 12 μm in thickness. This film was exposed portion wise using incremental exposures on a Cannon 3000i4 exposure tool starting at 50 mJ/cm² incrementing the exposure dose by 50 mJ/cm². The coated, exposed wafer was then baked at 115° C. for 3 min, developed using 0.262N aqueous TMAH developer solution (two puddle development steps, 25 sec each), and rinsed with de-ionized water to provide a relief pattern. At the exposure dose of 150 mJ/cm² 65% of the film was retained in the exposed areas and 4 μm features were resolved.

LITHOGRAPHIC EXAMPLE 7

Lithographic Evaluation of PBO Precursor Polymer (Ib) with Dissolution Rate Modifier A photosensitive Formulation was prepared by mixing together 100 parts by weight of the PBO polymer from Synthetic Example 6, 200 parts of GBL, 5 parts of (5-toluylsulfonyloxyimino-5H-thiophen-2-ylidene)-2-methylphenylacetonitrile, 10 parts of Powderlink 1174, 10 parts of 2-oxepanone polymer with 2-ethyl-2-(hydroxymethyl)-1,3-propanediol and 3 parts of (triethoxysilyl)propylethylcarbamate.

This composition was then spin coated onto a silicon wafer and baked on a hotplate for 3 minutes at 120° C. to obtain a film of about 10 μm in thickness. This film was exposed portion wise using incremental exposures on a Cannon 3000i4 exposure tool starting at 50 mJ/cm² incrementing the exposure dose by 50 mJ/cm². The coated, exposed wafer was then baked at 115° C. for 3 min, developed using 0.262N aqueous TMAH developer solution (two puddle development steps, 30 sec each), and rinsed with de-ionized water to provide a relief pattern. At the exposure dose of 100 mJ/cm² 95% of the film was retained in the exposed areas and 15 μm features were resolved.

LITHOGRAPHIC EXAMPLE 8

Lithographic Evaluation of PBO Precursor Polymer (Ia) with 6-FDA/ODA Polyamic Acid A photosensitive formulation was prepared by mixing together 100 parts by weight of a PBO precursor polymer, prepared in the same way as in Synthetic Example 3, 250 parts of ethyl lactate, 5 parts of (5-toluylsulfonyloxyimino-5H-thiophen-2-ylidene)-2-methylphenyl-acetonitrile, 31.25 parts of 6-FDA/ODA polymer prepared in Synthetic Example 7, 10 parts of Powderlink, 10 parts of tripropylene glycol and 3 parts of (triethoxysilyl)propylethylcarbamate.

The photosensitive-formulation was then spin coated onto a silicon wafer and baked on a hotplate for 3 minutes at 120° C. to obtain a film of about 12 μm in thickness. This film was exposed portion wise using incremental exposures on a Cannon 3000i4 exposure tool starting at 50 mJ/cm² incrementing the exposure dose by 50 mJ/cm². The coated, exposed wafer was then baked at 120° C. for 3 min, developed for 95 seconds under a continuous spray of 0.262N aqueous TMAH solution, and rinsed with de-ionized water to provide a relief pattern. At the exposure dose of 150 mJ/cm² 50% of the film was retained in the exposed areas and 2 μm features were resolved.

LITHOGRAPHIC EXAMPLE 9

Lithographic Evaluation of PBO Precursor Polymer (Ia) with Two Dissolution Rate Modifiers A photosensitive formulation was prepared by mixing together 100 parts by weight of a PBO precursor polymer, prepared in the same way as in Synthetic Example 3, 250 parts of diacetone alcohol, 5 parts of (5-toluylsulfonyloxyimino-5H-thiophen-2-ylidene)-2-methylphenyl-acetonitrile, 31.25 parts of 6-FDA/ODA polymer prepared in Synthetic Example 7, 10 parts of Powderlink, 10 parts of tripropylene glycol and 3 parts of (triethoxysilyl)propylethylcarbamate.

The photosensitive formulation was then spin coated onto a silicon wafer and baked on a hotplate for 3 minutes at 120° C. to obtain a film of about 12 μm in thickness. This film was exposed portion wise using incremental exposures on a Cannon 3000i4 exposure tool starting at 50 mJ/cm² incrementing the exposure dose by 50 mJ/cm². The coated, exposed wafer was then baked at 120° C. for 3 min, developed for 95 seconds under a continuous spray of 0.262N aqueous TMAH solution, and rinsed with de-ionized water to provide a relief pattern. At the exposure dose of 150 mJ/cm² 60% of the film was retained in the exposed areas and 3 μm features were resolved.

LITHOGRAPHIC EXAMPLE 10

Lithographic Evaluation of PBO Precursor Polymer (Ia) with Two Dissolution Rate Modifiers A photosensitive formulation was prepared by mixing together 100 parts by weight of the PBO precursor polymer of Synthetic Example 3, 200 parts of GBL, 5 parts of (5-toluylsulfonyloxyimino-5H-thiophen-2-ylidene)-2-methylphenylacetonitrile, 63.6 parts of polyamic acid solution obtained in Synthetic Example 4,10 parts of Powderlink 1174, 10 parts of 2-oxepanone polymer with 2-ethyl-2-(hydroxymethyl)-1,3-propanediol and 3 parts of (triethoxysilyl)propylethylcarbamate.

The photosensitive formulation was then spin coated onto a silicon wafer and baked on a hotplate for 3 minutes at 110° C. to obtain a film of about 12 μm in thickness. This film was exposed portion wise using incremental exposures on a Cannon 3000i4 exposure tool starting at 50 mJ/cm² incrementing the exposure dose by 50 mJ/cm². The coated, exposed wafer was then baked at 120° C. for 3 min, developed using 0.262N aqueous TMAH developer solution (two puddle development steps, 30 sec each), and rinsed with de-ionized water to provide a relief pattern. At the exposure dose of 100 mJ/cm² 97% of the film was retained in the exposed areas and 7 μm features were resolved.

LITHOGRAPHIC EXAMPLE 11

Lithographic Evaluation of PBO Precursor Polymer (Ia) with Two Dissolution Rate Modifiers A photosensitive formulation was prepared by mixing together 100 parts by weight of a PBO polymer prepared in the same way as in Synthesis Example 3, 200 parts of GBL, 5 parts of (5-toluylsulfonyloxyimino-5H-thiophen-2-ylidene)-2-methylphenyl-acetonitrile, 15.62 parts of polyamic acid solution obtained in Synthetic Example 4, 10 parts of Powderlink 1174, 10 parts of 2-oxepanone polymer with 2-ethyl-2-(hydroxymethyl)-1,3-propanediol and 3 parts of (triethoxysilyl)propylethylcarbamate.

The photosensitive formulation was then spin coated onto a silicon wafer and baked on a hotplate for 3 minutes at 110° C. to obtain a film of about 12 μm in thickness. This film was exposed portion wise using incremental exposures on a Cannon 3000i4 exposure tool starting at 50 mJ/cm² incrementing the exposure dose by 50 mJ/cm². The coated, exposed wafer was then baked at 120° C. for 3 min, developed using 0.262N aqueous TMAH developer solution (two puddle development steps, 30 sec each), and rinsed with de-ionized water to provide a relief pattern. At the exposure dose of 100 mJ/cm² 97% of the film was retained in the exposed areas and 7 µm features were resolved.

LITHOGRAPHIC EXAMPLE 12

Lithographic Evaluation of PBO Precursor Polymer (Ia) with Two Dissolution Rate Modifiers A photosensitive formulation was prepared by mixing together 100 parts by weight of a PBO polymer prepared in the same way as in Synthesis Example 3, 200 parts of GBL, 5 parts of (5-toluylsulfonyloxyimino-5H-thiophen-2-ylidene)-2-methylphenyl-acetonitrile, 31.3 parts of polyamic acid solution obtained in Synthetic Example 4, 10 parts of Powderlink 1174, 5 parts of 2-oxepanone polymer with 2-ethyl-2-(hydroxymethyl)-1,3-propanediol and 3 parts of (triethoxysilyl)-propylethylcarbamate.

The formulation was then spin coated onto a silicon wafer and baked on a hotplate for 3 minutes at 110° C. to obtain a film of about 12 µm in thickness. This film was exposed portion wise using incremental exposures on a Cannon 3000i4 exposure tool-starting at 50 mJ/cm² incrementing the exposure dose by 50 mJ/cm². The coated, exposed wafer was then baked at 120° C. for 3 min, developed using 0.262N aqueous TMAH developer solution (two puddle development steps, 30 sec each), and rinsed with de-ionized water to provide a relief pattern. At the exposure dose of 100 mJ/cm² 97% of the film was retained in the exposed areas and 7 µm features were resolved.

LITHOGRAPHIC EXAMPLE 13

Lithographic Evaluation of PBO Precursor Polymer (Ia) with Two Dissolution Rate Modifiers A photosensitive formulation was prepared by mixing together 100 parts by weight of a PBO polymer prepared in the same way as in Synthesis Example 3, 200 parts of GBL, 5 parts of (5-toluylsulfonyloxyimino-5H-thiophen-2-ylidene)-2-methylphenyl-acetonitrile, 31.3 parts of polyamic acid solution obtained in Synthetic Example 4, 10 parts of Powderlink 1174, 15 parts of 2-oxepanone polymer with 2-ethyl-2-(hydroxymethyl)-1,3-propanediol and 3 parts of (triethoxysilyl)-propylethylcarbamate.

The photosensitive formulation was then spin coated onto a silicon wafer and baked on a hotplate for 3 minutes at 110° C. to obtain a film of about 12 µm in thickness. This film was exposed portion wise using incremental exposures on a Cannon 3000i4 exposure tool starting at 50 mJ/cm² incrementing the exposure dose by 50 mJ/cm². The coated, exposed wafer was then baked at 120° C. for 3 min, developed using 0.262N aqueous TMAH developer solution (two puddle development steps, 30 sec each), and rinsed with de-ionized water to provide a relief pattern. At the exposure dose of 100 mJ/cm² 97% of the film was retained in the exposed areas and 7 µm features were resolved.

LITHOGRAPHIC EXAMPLE 14

Lithographic Evaluation of PBO Precursor Polymer (Ia) with a Dissolution Rate Modifier A photosensitive formulation was prepared by mixing together 100 parts by weight of a PBO precursor polymer, prepared in the same way as in Synthetic Example 3, 200 parts of GBL, 5 parts of (5-propylsulfonyloxyimino-5H-thiophen-2-ylidene)-2-methylphenyl-acetonitrile, 10 parts of Cymel 303 and 10 parts of a 2-oxepanone polymer with 2-ethyl-2-(hydroxymethyl)-1,3-propanediol.

The photosensitive formulation was spin coated on the silicon wafer. The coated wafer was baked at 120° C. for 4 minutes. The thickness of the film thus obtained was about 10.3 µm. The coated silicon wafer was then exposed patternwise to broadband radiation measured with a 400 nm probe at an intensity of 5.5 MW/cm² for 54.5 seconds, resulting in an exposure energy of 300 mJ/cm². The wafer baked for 180 seconds at 120° C. and then developed in 0.262 N aqueous TMAH using multiple immersion development. The first immersion was for 100 seconds and the second immersion was for 250 seconds with a DI water rinse between and after the develop steps. The remaining film was 9.6 µm thick after development was completed. 200 µm vias (square holes) were resolved.

LITHOGRAPHIC EXAMPLES 15

Adhesion Test

The formulations prepared in lithographic example 4 and in lithographic example 6 were spin coated onto a silicon wafer. The coated wafers were baked at 120° C. for 3 minutes. The thickness of the films thus obtained was 7–8 µm. The wafers were then exposed patternwise using a broadband mercury lamp light for 108.2 seconds (the lamp output was 1000 mJ/cm² @ 400 nm during the exposure time) with Karl Suss MA-56 broadband exposure tool. A ten by ten grid of 2 mm squares was thus created. Then, the wafer was baked at 120° C. for 2 min and developed in 0.262 N aqueous tetramethylamonium hydroxide using puddle development (2 puddles, 25 sec each). The patterned films were cured under $N_2$ atmosphere at 350° C. for 1 hour. The wafers were then placed in a pressure cooker pot and were exposed to saturated steam at 121° C. for 100 hrs. Then, the adhesion of the films to the wafers was tested using a tape peel test using 3M tape#720 as described in ASTM D-3359-83. If no squares of the grid were peeled off, then the formulation passed the test. Both films had no adhesion losses after 1000 hrs of the test.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

What is claimed is:

1. A heat resistant negative working photosensitive composition that comprises
   (a) one or more polybenzoxazole precursor polymers (I):

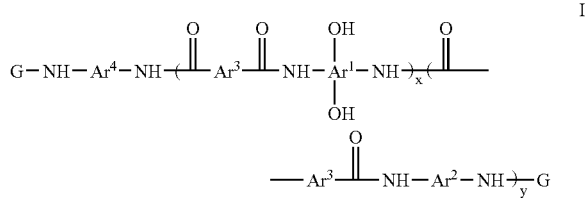

wherein x is an integer from about 10 to about 1000, y is an integer from 0 to about 900 and (x+y) is about less then 1000; $Ar^1$ is selected from the group consisting of a tetravalent aromatic group, a tetravalent heterocyclic group, or mixtures thereof; $Ar^2$ is selected from the group consisting a divalent aromatic, a divalent heterocyclic, a divalent alicyclic, or a divalent aliphatic group that may contain silicon; $Ar^3$ is selected from the group consisting a divalent aromatic group, a divalent aliphatic group, a divalent heterocyclic group, or mixtures thereof; $Ar^4$ is selected from the group consisting $Ar^1$ (OH)$_2$ or $Ar^2$; G is H or an organic group having a group attached directly to the terminal NH of the polymer and wherein said group attached directly to the terminal NH of the polymer is selected from the group consisting of a carbonyl, a carbonyloxy and a sulfonyl group;

(b) one or more photo-active compounds which release acid upon irradiation (PAGs);

(c) one or more latent crosslinkers, each of which contains at least two ~N—(CH$_2$OR)$_n$ units where n=1 or 2, and R is a linear or branched $C_1$–$C_8$ alkyl group;

(d) at least one solvent, and (e) at least one dissolution rate modifier to increase the dissolution rate with the proviso that when the latent crosslinker is highly reactive, the dissolution rate modifier does not contain carboxylic acid groups.

2. A heat resistant negative working photoresist composition according to claim 1, wherein G is H.

3. A heat resistant negative working photoresist composition according to claim 1, wherein G is an organic group J having a group attached directly to the terminal NH of the polymer and wherein said group attached directly to the terminal NH of the polymer is selected from the group consisting of a carbonyl, a carbonyloxy and a sulfonyl group.

4. A heat resistant negative working photoresist composition according to claim 1 wherein the dissolution rate modifier to increase the dissolution rate is selected from the group consisting of polyols, phenolic compounds with at least two hydroxyl groups and compounds containing carboxylic acid groups.

5. A heat resistant negative working photoresist composition according to claim 4 wherein the dissolution rate modifier to increase the dissolution rate is selected from the group consisting of ethylene glycol, diethylene glycol, polyethylene glycol, propylene glycol, tripropylene glycol, polypropylene glycol, glycerol, butane diol, hexane diol, sorbitol, cyclohexanediol, 4,8-bis(hydroxymethyl)-tricyclo (5.2.1.0/2,6)decane, a 2-oxepanone co-polymer with 2-ethyl-2-(hydroxymethyl)-1,3-propanediol, hydroquinone, 1,1,1-tris(4-hydroxyphenyl)ethane, anthrarobin, 2,7-dihydroxynaphthalene, 4,4-biphenol, 3-methoxycatechol, poly (hydroxystyrene), novolacs, calixarenes, and compounds containing carboxylic acid groups selected from those of the formulae

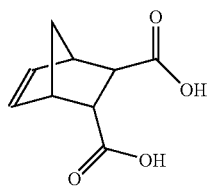

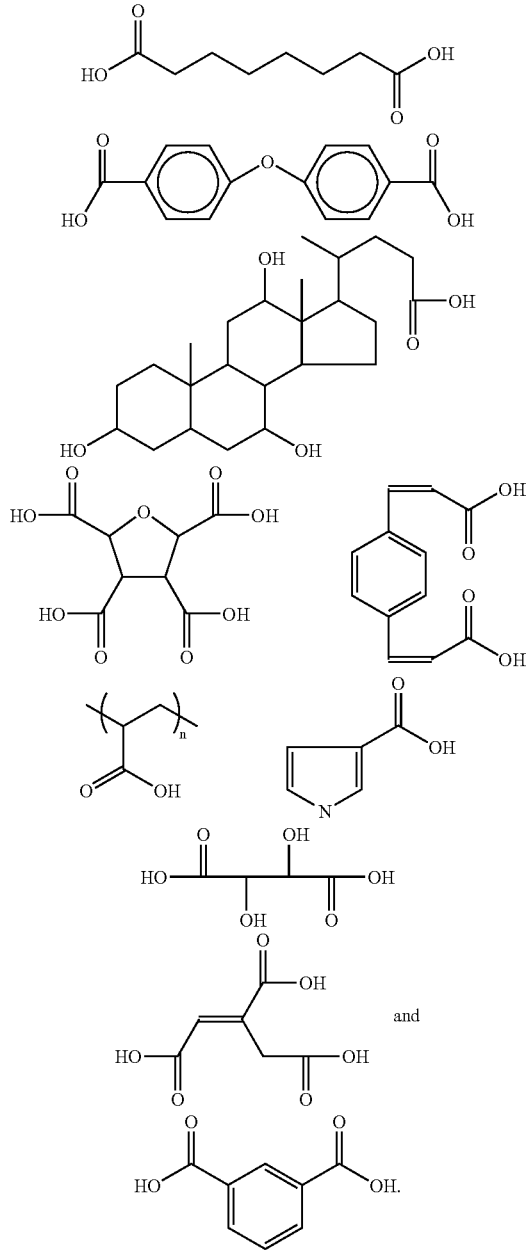

6. A heat resistant negative working photoresist composition according to claim 1 wherein the dissolution rate modifier to increase the dissolution rate is a polyamic acid of the structure (VII):

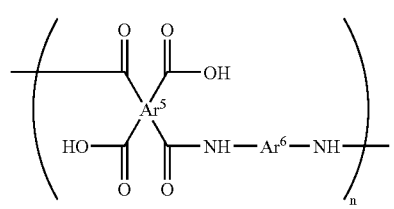

where n is an integer ranging from about 5 to about 200, and Ar⁶ is selected from the group consisting of a divalent aromatic group, a divalent heterocyclic group, a divalent alicyclic group, a divalent aliphatic group that may contain silicon, or mixtures thereof, and Ar⁵ is selected from the group consisting of a tetravalent aromatic group, a tetravalent heterocyclic group, a tetravalent cycloaliphatic group, or a tetravalent alicyclic group, with the proviso that each valence has at least one of the other valences ortho to it.

7. A heat resistant negative working photoresist composition according to claim 1 wherein the one or more latent crosslinkers are selected from the group consisting of alkoxymethylmelamines, alkoxymethylglycolurils, alkoxymethylbenzoguanamines, alkoxymethyldiguanamines derived from diguanamines and melamine or benzoguanamine polymers.

8. A heat resistant negative working photoresist composition according to claim 1 wherein the one or more latent crosslinkers are selected from the group consisting of compounds of the formulae

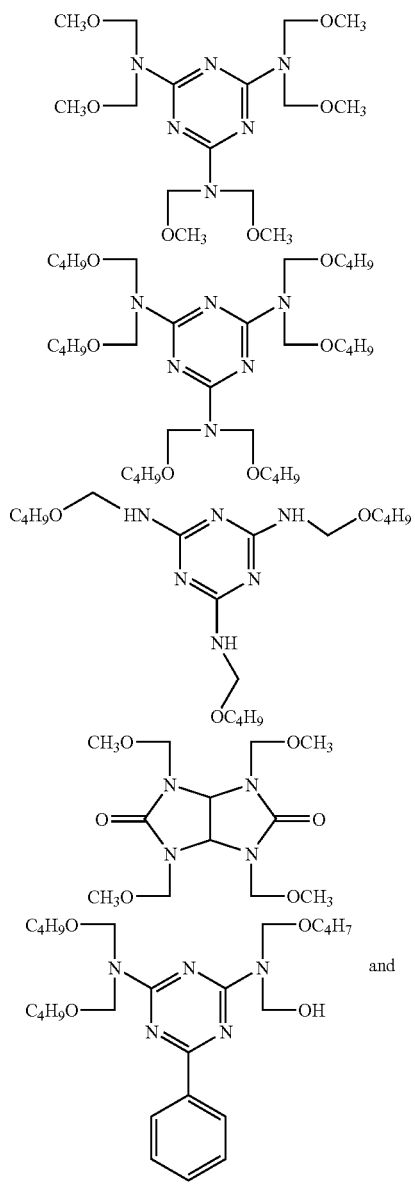

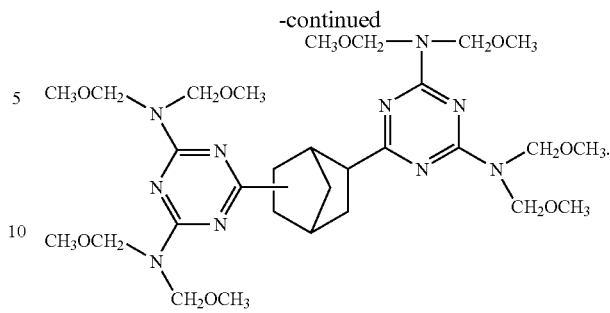

9. A heat resistant negative working photoresist composition according to claim 1 additionally comprising an adhesion promoter.

10. A heat resistant negative working photoresist composition according to claim 9 wherein the adhesion promoter is an amino silane.

11. A heat resistant negative working photoresist composition according to claim 9 wherein the adhesion promoter is a compound of the structure XIV

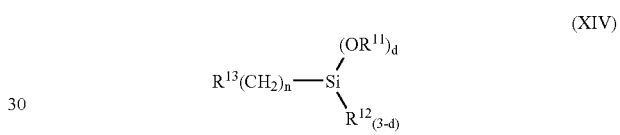

wherein each $R^{11}$ is independently selected from the group consisting of a $C_1$–$C_4$ alkyl group and a $C_5$–$C_7$ cycloalkyl group and each $R^{12}$ is independently selected from the group consisting of a $C_1$–$C_4$ alkyl group, a $C_1$–$C_4$ alkoxy group, a $C_5$–$C_7$ cycloalkyl group or a $C_5$–$C_7$ cycloalkoxy group, d is an integer from 0 to 3 and n is an integer from 1 to about 6 and $R^{13}$ is one of the following moieties selected from the group consisting of:

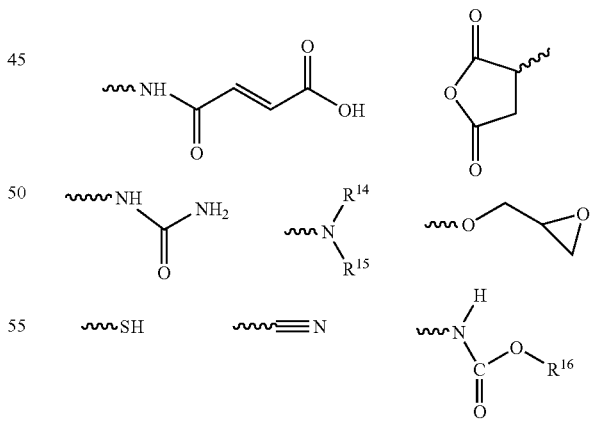

wherein each $R^{14}$ and $R^{15}$ are independently a substituted or unsubstituted $C_1$–$C_4$ alkyl group or a $C_5$–$C_7$ cycloalkyl group, and $R^{16}$ is a $C_1$–$C_4$ alkyl group and a $C_5$–$C_7$ cycloalkyl group.

12. A heat resistant negative working photoresist composition according to claim 11 wherein the adhesion promoter is selected from the group consisting of

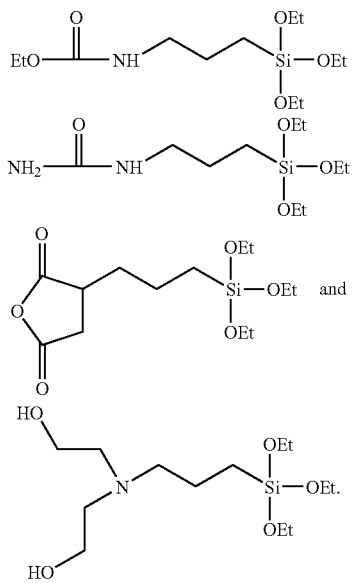

13. A heat resistant negative working photoresist composition according to claim 1 wherein the dissolution rate modifier to increase the dissolution rate is a compound containing carboxylic acid groups and the crosslinker is a glycoluril.

14. A heat resistant negative working photoresist composition according to claim 1 wherein the dissolution rate modifier to increase the dissolution rate is a polyol compound and the crosslinker is a melamine.

15. A process for forming a patterned image on a substrate, the process comprising the steps of:
(a) providing a substrate;
(b) coating on said substrate a negative-working photosensitive composition of claim 1;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

16. A process for forming a patterned image on a substrate, the process comprising the steps of:
(a) providing a substrate;
(b) coating on said substrate a negative-working photosensitive composition of claim 2;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

17. A process for forming a patterned image on a substrate, the process comprising the steps of:
(a) providing a substrate;
(b) coating on said substrate a negative-working photosensitive composition of claim 3;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

18. A process for forming a patterned image on a substrate, the process comprising the steps of:
(a) providing a substrate;
(b) coating on said substrate a negative-working photosensitive composition of claim 4;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

19. A process for forming a patterned image on a substrate, the process comprising the steps of:
(a) providing a substrate;
(b) coating on said substrate a negative-working photosensitive composition of claim 5;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

20. A process for forming a patterned image on a substrate, the process comprising the steps of:
(a) providing a substrate;
(b) coating on said substrate a negative-working photosensitive composition of claim 6;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

21. A process for forming a patterned image on a substrate, the process comprising the steps of:
(a) providing a substrate;
(b) coating on said substrate a negative-working photosensitive composition of claim 7
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

22. A process for forming a patterned image on a substrate, the process comprising the steps of:
(a) providing a substrate;
(b) coating on said substrate a negative-working photosensitive composition of claim 8;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

23. A process for forming a patterned image on a substrate, the process comprising the steps of:

(a) providing a substrate;
(b) coating on said substrate a negative-working photosensitive composition of claim 9;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

24. A process for forming a patterned image on a substrate, the process comprising the steps of:
(a) providing a substrate;
(b) coating on said substrate a negative-working photosensitive composition of claim 10;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

25. A process for forming a patterned image on a substrate, the process comprising the steps of:
(a) providing a substrate;
(b) coating on said substrate a negative-working photosensitive composition of claim 11;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

26. A process for forming a patterned image on a substrate, the process comprising the steps of:
(a) providing a substrate;
(b) coating on said substrate a negative-working photosensitive composition of claim 12;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

27. A process for forming a patterned image on a substrate, the process comprising the steps of:
(a) providing a substrate;
(b) coating on said substrate a negative-working photosensitive composition of claim 13;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

28. A process for forming a patterned image on a substrate, the process comprising the steps of:
(a) providing a substrate;
(b) coating on said substrate a negative-working photosensitive composition of claim 14;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

29. A process for forming a patterned image on a substrate according to claim 15 wherein the substrate of step (a) is treated with an adhesion promoter before coating step (b).

30. A process for forming a patterned substrate according to claim 29 wherein the substrate is treated with an adhesion promoter selected from the group consisting of vinylalkoxysilanes, methacryloxyalkoxysilanes, mercaptoalkoxysilanes, aminoalkoxysilanes, epoxyalkoxysilanes, and glycidoxyalkoxysilanes.

31. A process for forming a patterned substrate according to claim 30 wherein the substrate is treated with an adhesion promoter selected from the group consisting of gamma-aminopropyltrimethoxy-silane, gamma-glycidoxypropylmethyldimethoxysilane, gamma-glycidoxypropylmethyldiethoxysilane, gamma-mercaptopropylmethyldimethoxysilane, 3-methacryloxypropyldimethoxymethylsilane, and 3-methacryloxypropyltrimethoxysilane.

32. A substrate having a patterned image produced by the process of claim 15.

33. A substrate having a patterned image produced by the process of claim 16.

34. A substrate having a patterned image produced by the process of claim 17.

35. A substrate having a patterned image produced by the process of claim 18.

36. A substrate having a patterned image produced by the process of claim 19.

37. A substrate having a patterned image produced by the process of claim 20.

38. A substrate having a patterned image produced by the process of claim 21.

39. A substrate having a patterned image produced by the process of claim 22.

40. A substrate having a patterned image produced by the process of claim 23.

41. A substrate having a patterned image produced by the process of claim 24.

42. A substrate having a patterned image produced by the process of claim 25.

43. A substrate having a patterned image produced by the process of claim 26.

44. A substrate having a patterned image produced by the process of claim 27.

45. A substrate having a patterned image produced by the process of claim 28.

46. A substrate having a patterned image produced by the process of claim 29.

47. A substrate having a patterned image produced by the process of claim 30.

48. A substrate having a patterned image produced by the process of claim 31.

49. An article of commerce having incorporated therein a patterned image of claim 32.

50. An article of commerce having incorporated therein a patterned image of claim 43.

51. An article of commerce having incorporated therein a patterned image of claim 46.

52. An article of commerce of claim 49 wherein the item of commerce is selected from the group consisting of memory devices, logic devices and plating stencils.

* * * * *